US009455205B2

(12) United States Patent
Zundel et al.

(10) Patent No.: US 9,455,205 B2
(45) Date of Patent: Sep. 27, 2016

(54) SEMICONDUCTOR DEVICES AND PROCESSING METHODS

(71) Applicant: Infineon Technologies AG, Neubiberg (DE)

(72) Inventors: Markus Zundel, Egmating (DE); Franz Hirler, Isen (DE); Peter Nelle, Munich (DE); Ludger Borucki, Munich (DE); Markus Winkler, Munich (DE); Erwin Vogl, Hallbergmoos (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 142 days.

(21) Appl. No.: 14/055,982

(22) Filed: Oct. 17, 2013

(65) Prior Publication Data
US 2014/0097431 A1    Apr. 10, 2014

Related U.S. Application Data

(63) Continuation-in-part of application No. 13/647,480, filed on Oct. 9, 2012, now Pat. No. 9,099,419.

(30) Foreign Application Priority Data

Oct. 9, 2013  (DE) .......................... 10 2013 111 154

(51) Int. Cl.
*G01R 31/26* (2014.01)
*H01L 21/66* (2006.01)

(52) U.S. Cl.
CPC ............... *H01L 22/14* (2013.01); *H01L 22/34* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,690,062 B2 * | 2/2004 | Henninger et al. ........... | 257/340 |
| 7,253,475 B2 * | 8/2007 | Schaffer ........................ | 257/341 |
| 7,893,486 B2 * | 2/2011 | Hirler et al. .................. | 257/328 |
| 8,994,078 B2 * | 3/2015 | Kueck et al. ................. | 257/280 |
| 9,099,419 B2 * | 8/2015 | Zundel ..................... | H01L 22/34 324/762.01 |
| 9,166,027 B2 * | 10/2015 | Sandow ............... | H01L 29/7393 257/139 |
| 2003/0178676 A1 | 9/2003 | Henninger et al. | |
| 2005/0157571 A1 | 7/2005 | Schaffer | |
| 2006/0145230 A1 * | 7/2006 | Omura ................ | H01L 29/8725 257/302 |
| 2007/0138544 A1 | 6/2007 | Hirler et al. | |
| 2009/0289690 A1 * | 11/2009 | Hirler et al. .................. | 327/429 |
| 2010/0123187 A1 * | 5/2010 | Burke .................. | H01L 29/407 257/330 |
| 2010/0123188 A1 * | 5/2010 | Venkatraman ........ | H01L 29/407 257/330 |
| 2010/0140689 A1 * | 6/2010 | Yedinak .............. | H01L 29/0692 257/330 |
| 2014/0097431 A1 | 4/2014 | Zundel et al. | |
| 2014/0097863 A1 * | 4/2014 | Zundel et al. ........... | 324/762.01 |

* cited by examiner

*Primary Examiner* — Jermele M Hollington

(57) ABSTRACT

A method for processing a semiconductor device in accordance with various embodiments may include: providing a semiconductor device having a first pad and a second pad electrically disconnected from the first pad; applying at least one electrical test potential to at least one of the first pad and the second pad; and electrically connecting the first pad and the second pad to one another after applying the at least one electrical test potential.

22 Claims, 15 Drawing Sheets

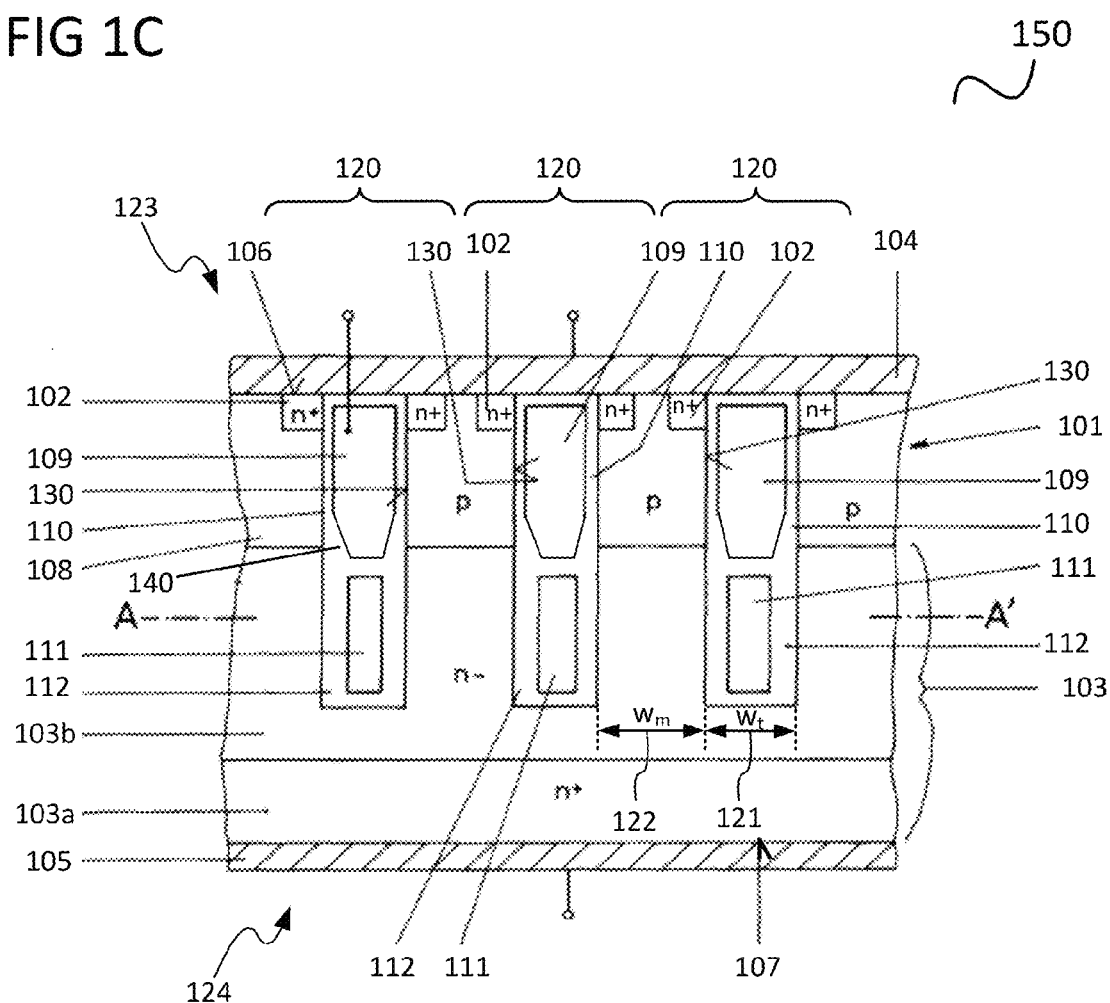

702 — Providing a semiconductor device to be tested, the semiconductor device including at least one device cell, the at least one device cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode 704 — Applying at least one electrical test potential to at least the at least one additional electrode to detect defects in the at least one device cell

752 — Providing a workpiece, the workpiece including a transistor to be tested, the transistor including a plurality of cells electrically connected in parallel, each cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode 754 — Applying a plurality of test potentials to at least the at least one additional electrode of the cells to detect defective cells among the plurality of cells

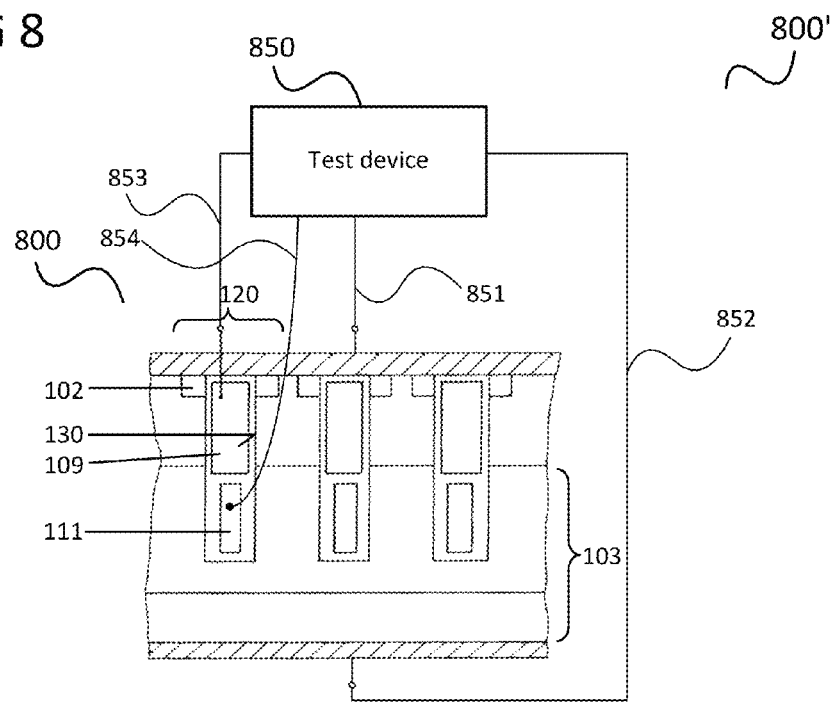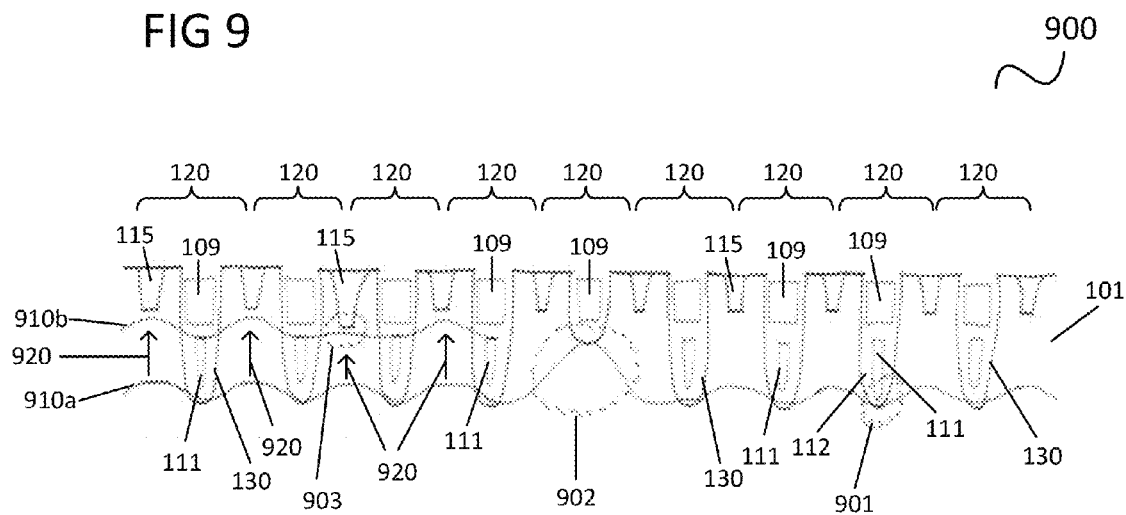

FIG 10

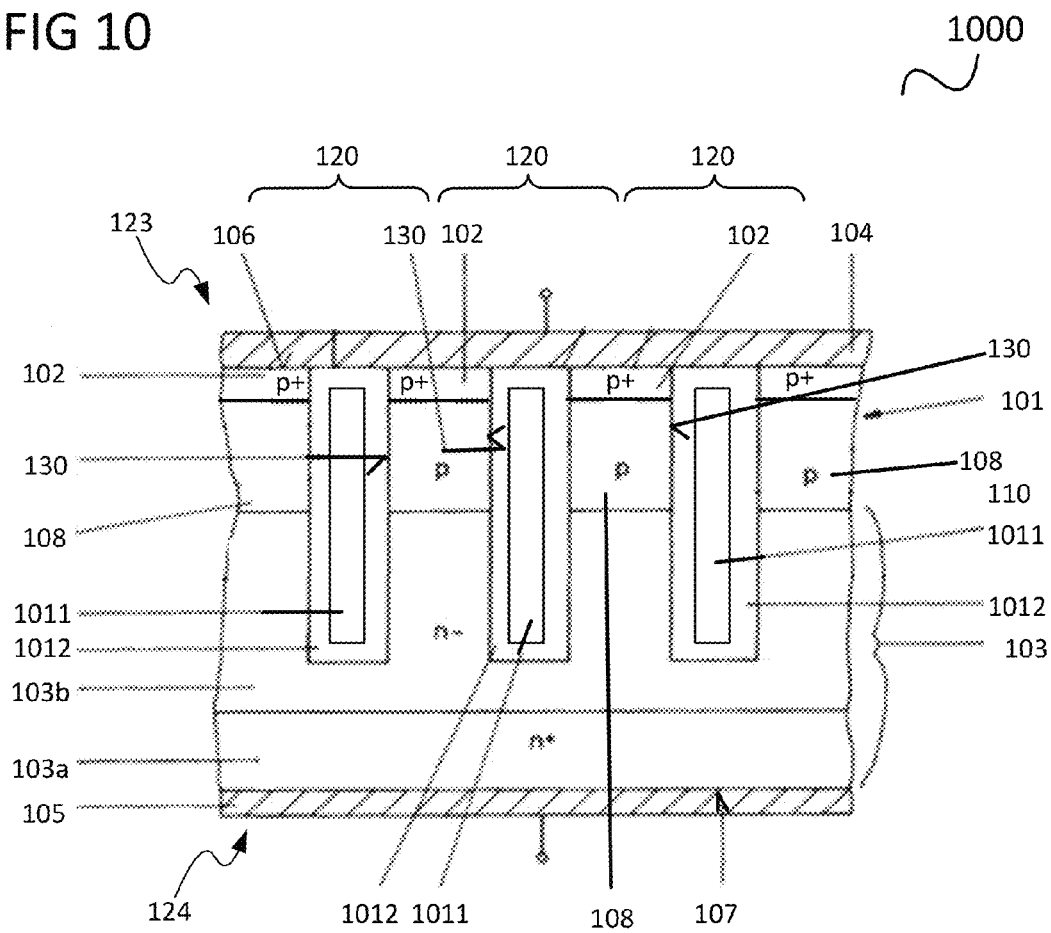

Providing a semiconductor device to be tested, the semiconductor device being configured as a diode and including at least one device cell, the at least one device cell including at least one trench, at least one first terminal electrode region, at least one second terminal electrode region, and at least one electrode disposed at least partially in the at least one trench, wherein an electrical potential of the at least one electrode may be controlled separately from electrical potentials of the at least one first terminal electrode region and the at least one second terminal electrode region — 1102

Applying at least one electrical test potential to at least the at least one electrode to detect defects in the at least one device cell — 1104

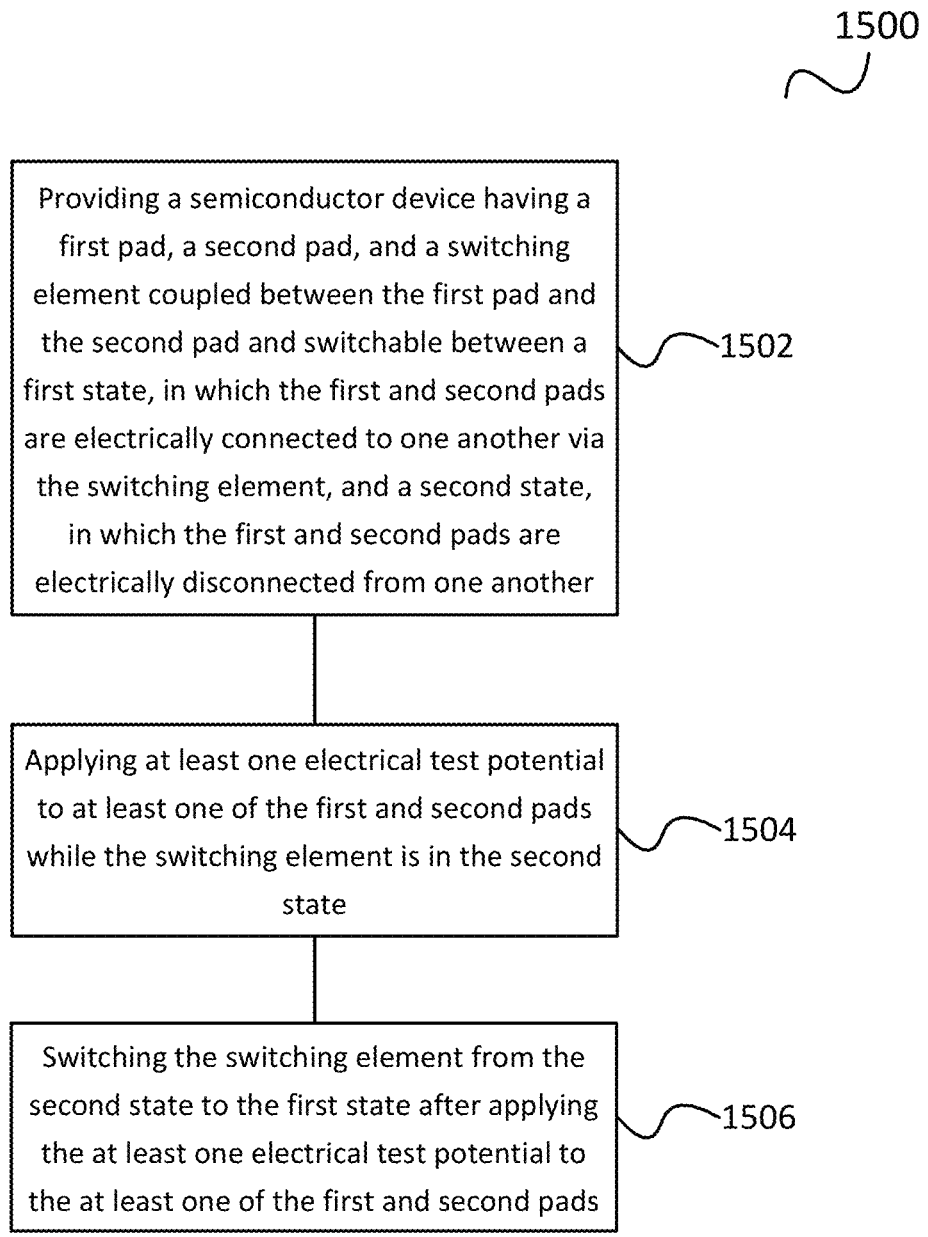

SEMICONDUCTOR DEVICES AND PROCESSING METHODS

RELATED APPLICATIONS

The present application is a continuation-in-part application and claims the benefit under 35 U.S.C. 120 of U.S. application Ser. No. 13/647,480 filed on Oct. 9, 2012, currently pending, and is furthermore related to and claims the priority under 35 U.S.C. 119 of German patent application no. 10 2013 111 154.8, filed on Oct. 9, 2013, the contents of all of which are incorporated herein by reference in their entirety.

TECHNICAL FIELD

Various embodiments relate to semiconductor devices and methods for processing a semiconductor device.

BACKGROUND

One type of semiconductor devices are trench devices such as trench transistors, e.g. trench field effect transistors (FETs) or trench insulated-gate bipolar transistors (IGBTs). Trench devices having a high or very high integration density may include a large number (e.g. thousands, tens of thousands, hundreds of thousands, or millions, or even more) of cells, sometimes also referred to as a cell field. Already one or a few defective cells in a cell field may affect a device's operating behavior and may even render a device unusable. Thus, it may be desirable to detect devices with defective cells in a pre-test of the devices (e.g. in a front end processing stage), for example in order to prevent defective devices from being delivered to customers. In this context, it may be desirable to apply individual test potentials to one or more contact pads coupled to the cells.

SUMMARY

In accordance with various embodiments, a method for processing a semiconductor device may include: providing a semiconductor device having a first pad and a second pad electrically disconnected from the first pad; applying at least one electrical test potential to at least one of the first pad and the second pad; and electrically connecting the first pad and the second pad to one another after applying the at least one electrical test potential.

In accordance with various embodiments, a semiconductor device may include: at least one device cell including at least one trench, at least one first terminal electrode terminal region, at least one second terminal electrode region, at least one gate electrode, and at least one additional electrode disposed at least partially in the at least one trench; a first pad coupled to the at least one first electrode terminal region; a second pad coupled to the at least one additional electrode; and an electrically conductive layer disposed over at least a portion of the first pad and the second pad and electrically connecting the first pad to the second pad.

In accordance with various embodiments, a method for processing a semiconductor device may include: providing a semiconductor device having a first pad, a second pad, and a switching element coupled between the first pad and the second pad and switchable between a first state, in which the first and second pads are electrically connected to one another via the switching element, and a second state, in which the first and second pads are electrically disconnected from one another; applying at least one electrical test potential to at least one of the first and second pads while the switching element is in the second state; and switching the switching element from the second state to the first state after applying the at least one electrical test potential to the at least one of the first and second pads.

In accordance with various embodiments, a semiconductor device may include: at least one device cell including at least one trench, at least one first terminal electrode terminal region, at least one second terminal electrode region, at least one gate electrode, and at least one additional electrode disposed at least partially in the at least one trench; a first pad coupled to the at least one first electrode terminal region; a second pad coupled to the at least one additional electrode; a switching element electrically coupled between the first pad and the second pad and switchable between a first state, in which the first and second pads are electrically connected to one another via the switching element, and a second state, in which the first and second pads are electrically disconnected from one another.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1C shows a cross-sectional view of a further exemplary semiconductor device for use with one or more embodiments;

FIG. 7A shows a test method according to various embodiments;

FIG. 7B shows a test method according to various embodiments;

FIG. 8 shows a test arrangement according to various embodiments;

FIG. 9 shows a semiconductor device having various cell defects, and further shows an electrical scan curve, for illustrating aspects of one or more embodiments;

FIG. 10 shows a cross-sectional view of an exemplary semiconductor device for use with one or more embodiments;

FIG. 11 shows a test method according to various embodiments;

FIG. 15 shows a method for processing a semiconductor device according to various embodiments;

DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, . . . , etc.

The term "a plurality" may be understood to include any integer number greater than or equal to two, i.e. two, three, four, five, . . . , etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupling" or "connection" may be understood to include both the case of a direct "coupling" or "connection" and the case of an indirect "coupling" or "connection".

Figure 1A:
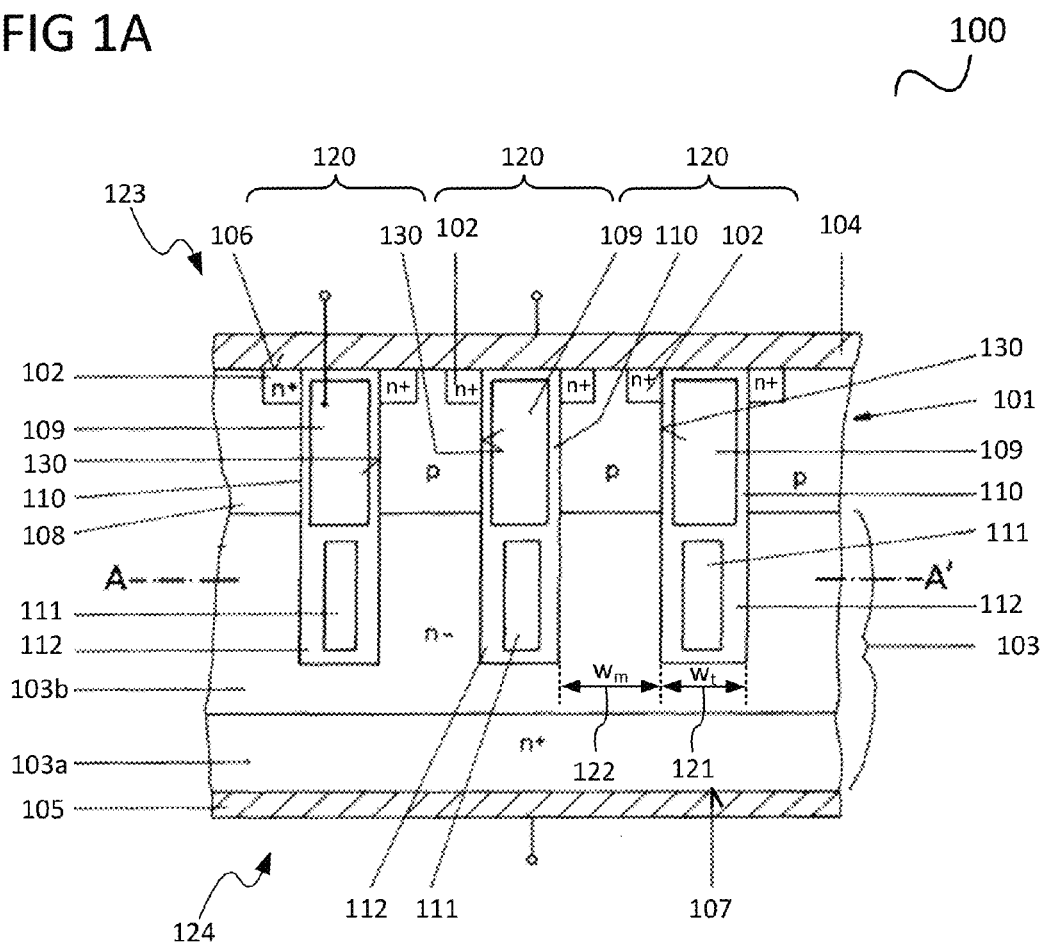
FIG. 1A shows a cross-sectional view of an exemplary semiconductor device for use with one or more embodiments.
Figure 1B:
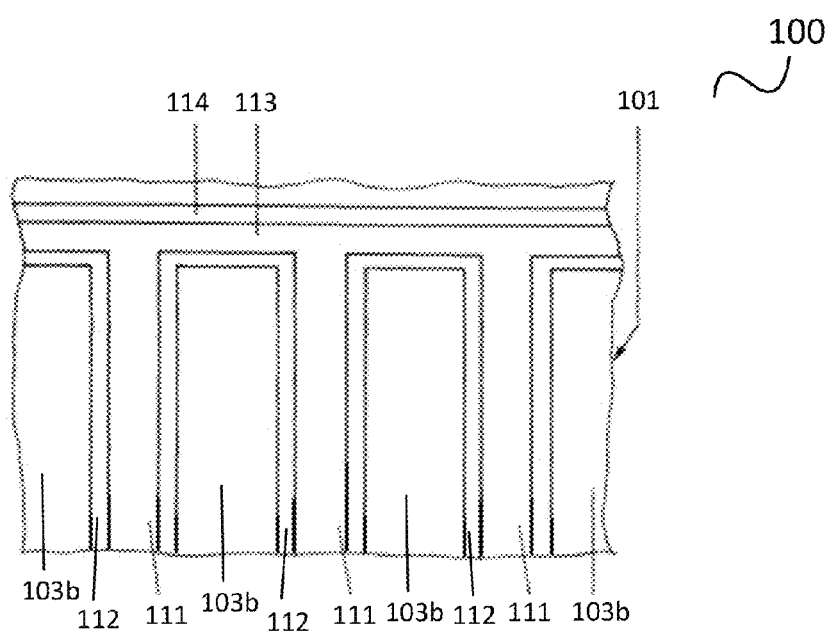
FIG. 1B shows a cross-sectional view along line A-A' in FIG. 1A.

FIG. 1A shows a cross-sectional view of an exemplary semiconductor device 100 for use with one or more embodiments, and FIG. 1B shows a cross-sectional view of the semiconductor device 100 along line A-A' in FIG. 1A.

The semiconductor device 100 may include a first side 123 and a second side 124, which may be opposite the first side 123. The first side 123 may, for example, be a front side of the semiconductor device 100 and the second side 124 may, for example, be a back side of the semiconductor device 100. Semiconductor device 100 may be configured as a trench transistor including a plurality of device cells 120 (i.e. transistor cells in this case), each device cell 120 including a trench 130. Arrow 121 indicates a trench width $w_t$ (width of trench 130), and arrow 122 indicates a distance $w_m$, between neighboring trenches 130, sometimes also referred to as mesa width. Three cells 120 are shown for purposes of illustration, however it may be understood that the number of cells 120 may be different from three, and may for example be much larger than three, e.g. on the order of thousands, tens of thousands, or millions, or even more, of cells. Semiconductor device 100 may, for example, be configured as a power transistor, for example as a power field-effect transistor. e.g. a power MOSFET.

Semiconductor device 100 may include a semiconductor body 101, in which a plurality of first terminal electrode regions 102 and a second terminal electrode region 103 may be formed. The first terminal electrode regions 102 may be source regions of the transistor, and the second terminal electrode region 103 may be a drain region of the transistor. In this case, the first terminal electrode regions 102 as a whole may also be referred to as a source zone of the transistor, and the second terminal electrode region 103 may also be referred to as a drain zone of the transistor. The first terminal electrode regions 102 may be connected to a first terminal electrode 104 and the second terminal electrode region 103 may be connected to a second terminal electrode 105. The first terminal electrode 104 may be a source electrode of the transistor, and the second terminal electrode 105 may be a drain electrode of the transistor. Alternatively, the first terminal electrode 104 may be a drain electrode of the transistor, and the second terminal electrode 105 may be a source electrode of the transistor. The first terminal electrode 104 may be formed over a first side 106 of the semiconductor body 101 and the second terminal electrode 105 may be formed over a second side 107 of the semiconductor body 101, which may be opposite the first side 106. The first side 106 may, for example, be a front side of the semiconductor body 101 and the second side 107 may, for example, be a back side of the semiconductor body 101. The first side 106 of the semiconductor body 101 may, for example, be proximate the first side 123 of the semiconductor device 100 and the second side 107 of the semiconductor body 101 may, for example, be proximate the second side 124 of the semiconductor device 100.

The first terminal electrode regions 102 and the second terminal electrode region 103 may be of the same conductivity type and may, for example, be n-doped. The second terminal electrode region 103 may include an n-doped (e.g. highly n-doped, e.g. n+ doped) first subregion 103a adjacent to the second terminal electrode 105, and an n-doped (e.g. lightly n-doped, e.g. n-doped) second subregion 103b adjacent to a side of the first subregion 103a that faces away from the second terminal electrode 105. The first subregion 103a may have a higher dopant concentration than the second subregion 103b. P-doped body regions 108 may be formed between the first terminal electrode regions 102 and the second subregion 103b of the second terminal electrode region 103. Conductive channels may form in the body regions 108 during an on-state of the semiconductor device (transistor) 100.

The first terminal electrode regions 102, the body regions 108 and the second terminal electrode region 103 may be disposed one over the other in vertical direction of the semiconductor body 101.

A plurality of first terminal electrode regions 102 may be provided in the semiconductor body 101, wherein a gate electrode 109 may in each case extend from each of the first terminal electrode regions 102 through the body regions 108 into the second subregion 103b of the second terminal electrode region 103. The first terminal electrode regions 102 may be connected to a common first electrode 104. The gate electrodes 109 may be insulated from the semiconductor body 101 by a first insulating layer 110. The gate electrodes 109 may be connectable or connected to a common potential (e.g. gate driving potential).

An additional electrode 111 may in each case be assigned to each of the gate electrodes 109. The additional electrodes 111 may be located entirely within the second subregion 103b of the second terminal electrode region 103, with each of the additional electrodes 111 being surrounded by a respective second insulating layer 112 and located adjacent to a corresponding gate electrode 109. A gate electrode 109 and an additional electrode 111 may in each case be disposed one over the other in a vertical direction of the semiconductor body 101 in a common trench 130, which may extend in the vertical direction of the semiconductor body 101 from the first side 106 as far as into the second terminal electrode region 103. The gate electrodes 109 and additional electrodes 111 located in a common trench 130 may be insulated from one another by their respective first and second insulating layers 110, 112.

The additional electrodes 111 may be electrically connected together to apply a common electrical potential to all of the additional electrodes 111.

As shown in FIG. 1B, the additional electrodes 111 may be configured as plates. A common plate 113 may be provided to apply a common electrical potential. The common plate 113 may connect the additional electrodes 111 with one another and may be insulated from the semiconductor body 101 by an electrically insulating layer 114. The electrical connection of the additional electrodes 111 with one another may be achieved in the trench (as shown) or may be achieved at the surface of semiconductor device 100. The gate electrodes 109 may be configured as plates and may be connected to a common electrical potential via a common plate in a similar manner as the additional electrodes 111. The electrical connection of the gate electrodes 109 with one another may be achieved in the trench or may be achieved at the surface of semiconductor device 100. It may be provided that there is no electrically conductive connection between the gate electrodes 109 and the additional electrodes 111. In other words, the gate electrodes 109 and additional electrodes 111 may be electrically separated or disconnected from each other.

Each of the gate electrodes 109 and the additional electrodes 111 and each of the first terminal electrode regions 102 may be part of a respective cell 120 of semiconductor device 100. For example in order to be able to switch high currents, it may be desirable to provide a large number of uniformly configured cells 120.

As all cells 120 of semiconductor device 100 may be connected to the same electrical potentials (e.g. supply potentials and drive potentials), all cells 120 may be driven in the same manner. In other words, the first terminal electrode regions 102 of all cells 120 may be all connected to the same electrical potential, the gate electrodes 109 of all cells 120 may be all connected to the same electrical potential, and the additional electrodes 111 of all cells 120 may be all connected to the same electrical potential. Furthermore, a common second terminal electrode region 103 may be provided for all cells 120 according to this example.

The gate electrodes 109 may serve to control the switching state of the semiconductor device (transistor) 100. The additional electrodes 111 may serve to "shield" the gate electrodes 109 when a supply voltage is applied between the first and second terminal electrodes 104, 105 (or, between the first terminal electrode regions 102 and the second terminal electrode region 103), i.e. the additional electrodes 111 may serve to reduce the strength of an electric field acting on the first insulating layer 110 of the gate electrodes 109. Thus, the additional electrodes 111 may also be referred to as "shield electrodes". For example in case that the additional electrodes 111 are configured as plates, they may sometimes also be referred to as field plates.

Due to the aforementioned shielding effect, the first insulating layer 110 may, for example, be configured with a smaller thickness while obtaining the same electric strength as in similar devices without additional (shield) electrodes 111. The reduced insulating layer thickness may, for example, reduce the on-state resistance of the semiconductor device 100 and/or parasitic capacitances between the gate electrodes 109 and the second terminal electrode region 103, which may lead to reduced switching losses. Furthermore, as in the semiconductor device 100 a voltage drop between the first terminal electrode 104 and the second terminal electrode 105 may occur primarily in the region of the additional electrodes 111, it may be possible to increase the doping of the second terminal electrode region 103 compared to devices having no additional (shield) electrodes 111, without adding stress in form of a higher field strength onto the gate electrodes 109.

As mentioned above, the first terminal electrode regions 102 may be source regions and the first terminal electrode 104 may be a source electrode, which may be at the first side 123 of the transistor 100, and the second terminal electrode region 103 may be a drain region and the second terminal electrode 105 may be a drain electrode, which may be at the second side 124 of the transistor 100. Alternatively, the transistor 100 may be implemented in a so-called source down configuration. In this case the situation in FIG. 1A may illustratively be flipped so that the source regions 102 may be at the second side 124 and the drain region 103 may be at the first side 123 of the transistor 100. In this configuration, the first terminal electrode 104 may be a drain electrode, the second terminal electrode 105 may be a source electrode, and the electrodes 109, 111 in the trenches 130 may be connected to pads at the first side 123 of the transistor 100. Alternatively, electrode 109 may be connected to a pad at the first side 123 of the transistor 100 and electrode 111 may be connected to a pad at the second side 124 of the transistor 100. Similar considerations may apply for other semiconductor devices, e.g. transistors, described herein below.

FIG. 1C shows a cross-sectional view of a further exemplary semiconductor device 150 for use with one or more embodiments. A cross-sectional view along line A-A' in FIG. 1C may be similar as shown in FIG. 1B.

Semiconductor device 150 may be configured as a trench transistor and may be to some degree similar to semiconductor device 100 described above. In particular, reference numerals which are the same as there may denote the same or similar elements, which will thus not be described in detail again here. Reference is made to the description above.

Semiconductor device 150 differs from semiconductor device 100 in that the first insulating layer 110 may have a graded thickness in a region 140 proximate the lower end of the gate electrode 109. As shown, the thickness of the first insulating layer 110 may increase in the region 140 and may, for example, approach the thickness of the second insulating layer 112. This increase in the thickness may sometimes also be referred to as dielectric layer ramp (or oxide ramp in case of an oxide as insulating material).

Figure 2:
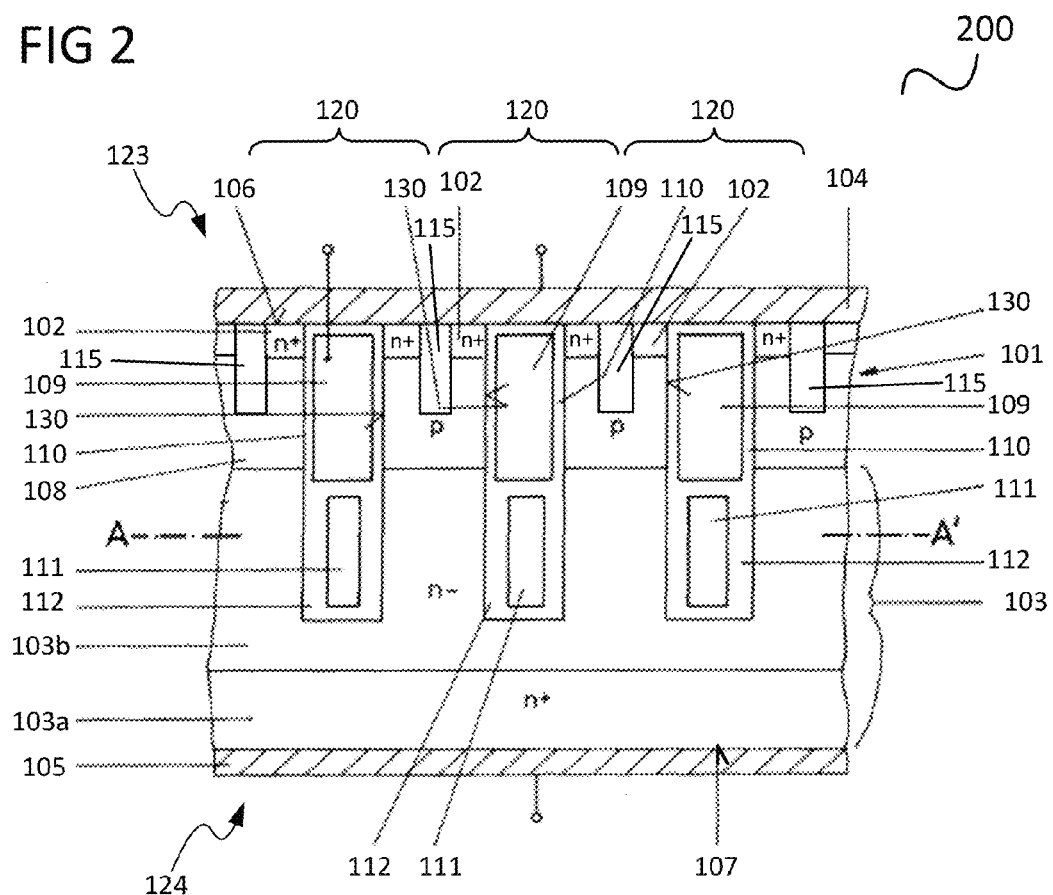
FIGS. 2 to 5 show cross-sectional views of further exemplary semiconductor devices for use with one or more embodiments.

FIG. 2 shows a cross-sectional view of a further exemplary semiconductor device 200 for use with one or more embodiments. A cross-sectional view along line A-A' in FIG. 2 may be similar as shown in FIG. 1B.

Semiconductor device 200 may be configured as a trench transistor and may be to some degree similar to semiconductor devices 100 and 150 described above. In particular, reference numerals which are the same as there may denote the same or similar elements, which will thus not be described in detail again here. Reference is made to the description above.

Semiconductor device 200 may include one or more contact trenches 115 that may reach from the first side 106 of the semiconductor body 101 into the semiconductor body 101. The contact trenches 115 may end in the respective body regions 108. The contact trenches 115 may be disposed between the trenches 130. For example, a contact trench 115 may in each case be disposed between the trenches 130 of two neighboring device cells 120. The contact trench 115 may allow for electrically contacting a respective body region 108, for example by means of a highly doped region at the bottom of the contact trench 115. Furthermore, the contact trench 115 may also allow for electrically contacting the first terminal electrode regions 102, for example by means of highly doped regions at an upper part of the contact trench 115.

Contacting also the first terminal electrode regions 102 via the contact trench 115 may, for example, be applied in cases where an integration density may be so high that there may be not enough space to contact the first terminal electrode regions 102 from the surface.

Figure 3:
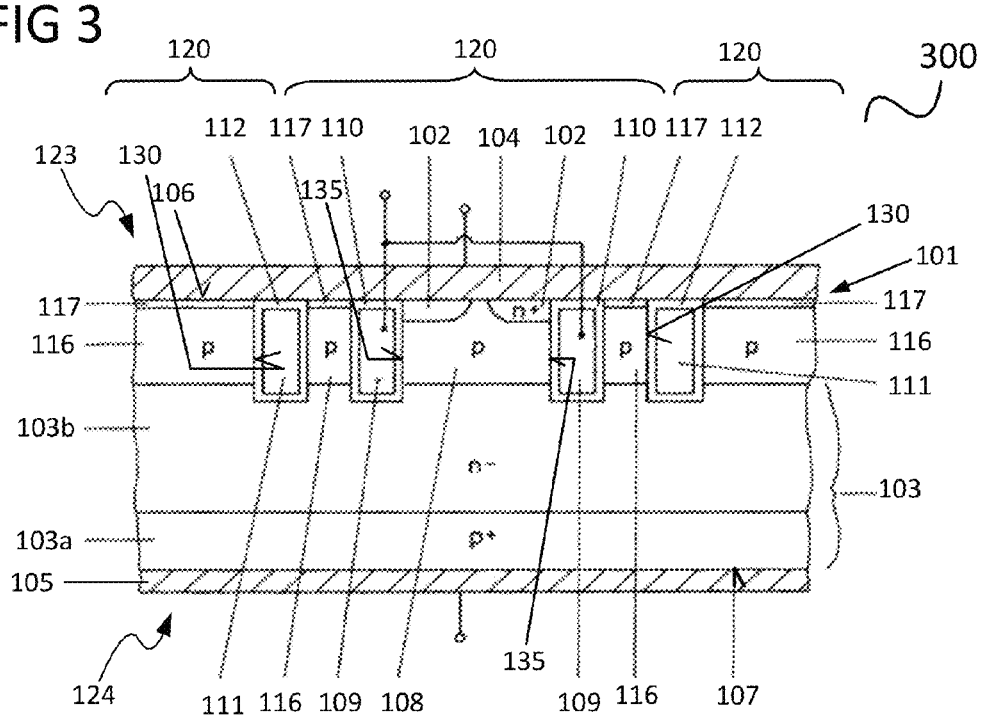

FIG. 3 shows a cross-sectional view of a further exemplary semiconductor device 300 for use with one or more embodiments.

Semiconductor device 300 may be configured as a trench transistor including a plurality of transistor cells 120 and may be to some degree similar to semiconductor devices 100, 150 and 200 described above. In particular, reference numerals which are the same as there may denote the same or similar elements, which will thus not be described in detail again here. Reference is made to the description above.

A transistor cell 120 in semiconductor device 300 may include two first trenches 130 and two second trenches 135 disposed next to each other in lateral direction of the semiconductor body 101. An additional electrode 111 may be disposed in each of the first trenches 130, and a gate electrode 109 may be disposed in each of the second trenches 135. The gate electrodes 109 may be surrounded by respective first insulating layers 110, and the additional electrodes 111 may be surrounded by respective second insulating layers 112. The first insulating layer 110 may have the same thickness as the second insulating layer 112. Alternatively, the first insulating layer 110 and the second insulating layer 112 may have different thicknesses. For example, the first insulating layer 110 may be thinner than the second insulating layer 112. The gate electrodes 109 may be disposed adjacent to first terminal electrode regions 102. The first terminal electrode regions 102 may be connected to a first terminal electrode 104, which may be disposed over a first side 106 of the semiconductor body 101. A second terminal electrode 105 may be disposed over a second side 107 of the semiconductor body 101, which may be opposite the first side 106. The first side 106 may, for example, be a front side of the semiconductor body 101 and the second side 107 may, for example, be a back side of the semiconductor body 101. The second terminal electrode 105 may serve to contact a second terminal electrode region 103, which may include a p-doped (e.g. highly p-doped, e.g. p+ doped) first subregion 103a adjacent to the second terminal electrode 105 and an n-doped (e.g. lightly n-doped, e.g. n− doped) second subregion 103b adjacent to the first subregion 103a. A p-doped body region 108 may be formed between the second terminal electrode region 103 (or the second subregion 103b of the second terminal electrode region 103) and the first terminal electrode regions 102. The gate electrodes 109 may extend along the body region 108 as far as into the second terminal electrode region 103, starting from the first side 106 of the semiconductor body 101. Additional p-doped regions 116 may be formed between the gate electrodes 109 and the additional electrodes 111 above the second terminal electrode region 103 and below the first terminal electrode 104. The additional p-doped regions 116 may be insulated from the first terminal electrode 104 by means of respective insulating layers 117.

Semiconductor device 300 may operate as an insulated-gate bipolar transistor (IGBT), due to the complementary doping of the first and second subregions 103a, 103b of the second terminal electrode region 103.

Similarly as in semiconductor devices 100, 150, and 200, the additional electrodes 111 may shield the gate electrodes 109 and may prevent large field strengths at the first insulating layers 110.

Figure 4:
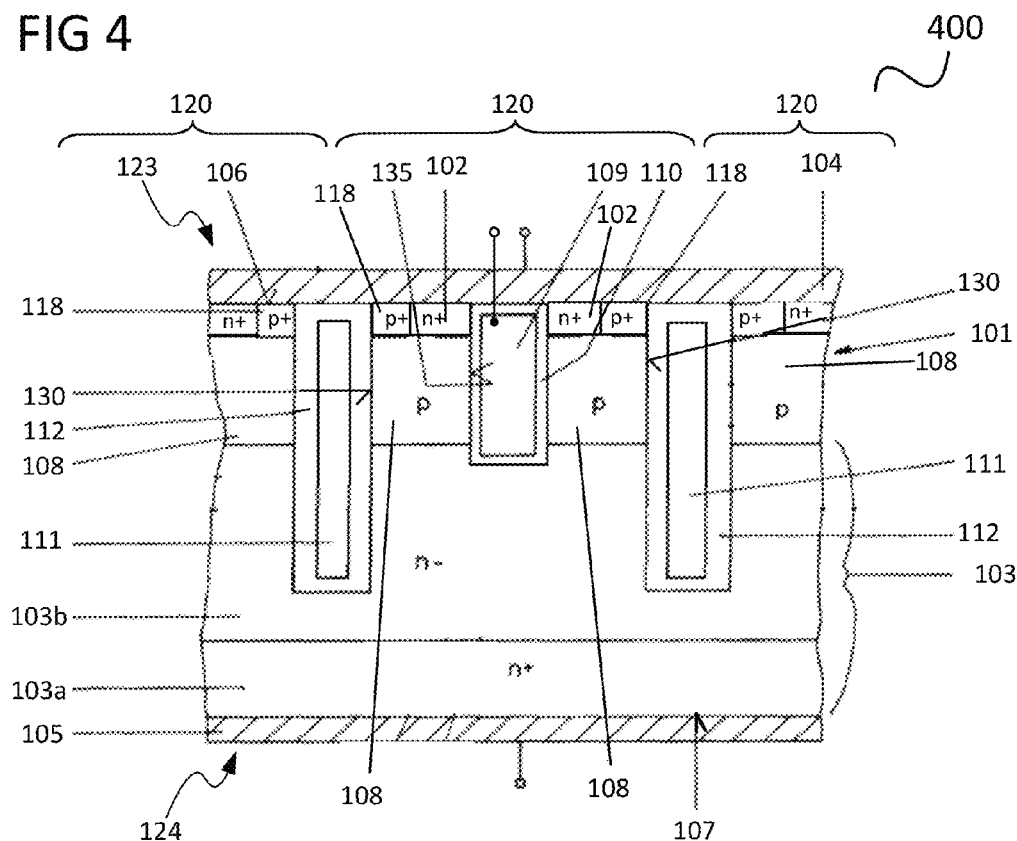

FIG. 4 shows a cross-sectional view of a further exemplary semiconductor device 400 for use with one or more embodiments.

Semiconductor device 400 may be configured as a trench transistor including a plurality of transistor cells 120 and may be to some degree similar to semiconductor devices 100, 150, 200 and 300 described above. In particular, reference numerals which are the same as there may denote the same or similar elements, which will thus not be described in detail again here. Reference is made to the description above.

A transistor cell 120 in semiconductor device 400 may include two first trenches 130 and a second trench 135 disposed next to each other in lateral direction of the semiconductor body 101. Additional electrodes 111 may be disposed in the first trenches 130, and a gate electrode 109 may be disposed in the second trench 135 of the cell 120. The second trench 135 may be disposed laterally between the two first trenches 130. Each first trench 130 may be shared by two adjacent cells 120, as shown in FIG. 4, which shows three cells 120, i.e. a center cell 120 and two neighboring cells 120 (only parts of the neighboring cells are shown). The gate electrode 109 may be surrounded by a first insulating layer 110, and the additional electrodes 111 may be surrounded by respective second insulating layers 112. The gate electrode 109 may be disposed adjacent to first terminal electrode regions 102. The first terminal electrode regions 102 may be connected to a first terminal electrode 104, which may be disposed over a first side 106 of the semiconductor body 101. A second terminal electrode 105 may be disposed over a second side 107 of the semiconductor body 101, which may be opposite the first side 106. The first side 106 may, for example, be a front side of the semiconductor body 101 and the second side 107 may, for example, be a back side of the semiconductor body 101. The second terminal electrode 105 may serve to contact a second terminal electrode region 103, which may include an n-doped (e.g. highly n-doped, e.g. n+ doped) first subregion 103a adjacent to the second terminal electrode 105 and an n-doped (e.g. lightly n-doped, e.g. n− doped) second subregion 103b adjacent to the first subregion 103a. P-doped body regions 108 may be formed between the second terminal electrode region 103 (or the second subregion 103b of the second terminal electrode region 103) and the first terminal electrode regions 102. The gate electrode 109 may extend along the body regions 108 as far as into the second terminal electrode region 103, starting from the first side 106 of the semiconductor body 101. The additional electrodes 111 may extend along the body regions 108 and along at least part of the second terminal electrode region 103 (e.g., at least part of the second subregion 103b of the second terminal electrode region 103, as shown). Thus, the additional electrodes 111 may extend deeper into the semiconductor body 101 than the gate electrode 109. P-doped (e.g. highly p-doped, e.g. p+ doped) regions 118 may be formed adjacent to the first terminal electrode regions 102 in the p-doped body regions 108 and may be connected to the first terminal electrode 104. The p-doped regions 118 may serve to electrically contact the body regions 108.

Similarly as in semiconductor devices 100, 150, 200, and 300, the additional electrodes 111 may shield the gate electrode 109 and may prevent large field strengths at the first insulating layer 110.

Figure 5:
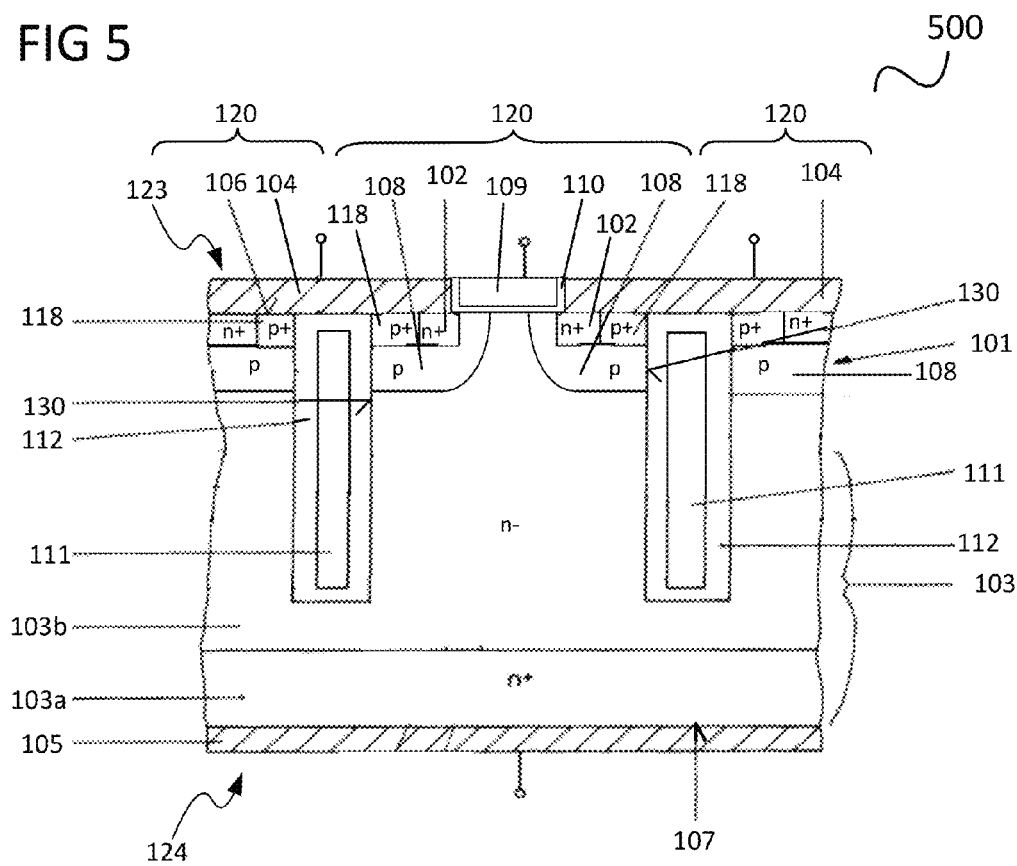

FIG. 5 shows a cross-sectional view of a further exemplary semiconductor device 500 for use with one or more embodiments.

Semiconductor device 500 is configured as a trench transistor including a plurality of transistor cells 120 and is to some degree similar to semiconductor devices 100, 150, 200, 300 and 400 described above. In particular, reference numerals which are the same as there may denote the same or similar elements, which will thus not be described in detail again here. Reference is made to the description above.

A transistor cell 120 in semiconductor device 500 may include two trenches 130 disposed next to each other in lateral direction of the semiconductor body 101. An additional electrode 111 may be disposed in each of the two trenches 130. A gate electrode 109 may be disposed over a first side 106 of a semiconductor body 101 between the two trenches 130. The first side 106 may, for example, be a front side of the semiconductor body 101. The gate electrode 109 may be insulated from the semiconductor body 101 by first insulating layer 110. The additional electrodes 111 may be surrounded by respective second insulating layers 112. P-doped body regions 108 may be formed in the semiconductor body 101 on either side of the gate electrode 109 and may be partially overlapped by the gate electrode 109. N-doped (e.g. highly n-doped, e.g. n+ doped) first terminal electrode regions 102 may be formed in the body regions 108 between the gate electrode 109 and a respective trench 130.

The first terminal electrode regions 102 may be connected to a first terminal electrode 104, which may be disposed over the first side 106 of the semiconductor body 101. P-doped (e.g. highly p-doped, e.g. p+ doped) regions 118 may be formed adjacent to the first terminal electrode regions 102 in the p-doped body regions 108 and may be connected to the first terminal electrode 104. The highly p-doped regions 118 may serve to electrically contact the body regions 108.

A second terminal electrode 105 may be disposed over a second side 107 of the semiconductor body 101, which may be opposite the first side 106. Second side 107 may, for example, be a back side of the semiconductor body 101. The second terminal electrode 105 may serve to contact a second terminal electrode region 103, which may include an n-doped (e.g. highly n-doped, e.g. n+ doped) first subregion 103a adjacent to the second terminal electrode 105 and an n-doped (e.g. lightly n-doped, e.g. n− doped) second subregion 103b adjacent to the first subregion 103a. The p-doped body regions 108 may be formed between the second terminal electrode region 103 (or the second subregion 103b of the second terminal electrode region 103) and the first terminal electrode regions 102. The gate electrode 109 may extend along a horizontal direction and may overlap parts of the body regions 108 and a part of the second terminal electrode region 103 (or of the second subregion 103b of the second terminal electrode region 103) between the body regions 108. The additional electrodes 111 may extend along the body regions 108 and along at least part of the second terminal electrode region 103 (e.g., at least part of the second subregion 103b of the second terminal electrode region 103, as shown). Thus, the additional electrodes 111 may be formed in the trenches 130 and may extend vertically into the semiconductor body 101 while the gate electrode 109 may be disposed over the semiconductor body 101.

Similarly as in semiconductor devices 100, 150, 200, 300, and 400, the additional electrodes 111 may shield the gate electrode 109 and may prevent large field strengths at the first insulating layer 110.

Gate electrodes and/or additional electrodes of semiconductor devices, such as gate electrodes 109 and/or additional electrodes 111 of semiconductor devices 100, 150, 200, 300, 400, and 500, may contain or consist of an electrically conductive material, for example polysilicon or a metal (or metal alloy), although other electrically conductive materials may be possible as well. Insulating layers insulating the gate electrodes 109 and/or additional electrodes 111, such as first insulating layer 110 and/or second insulating layer 112 of semiconductor devices 100, 150, 200, 300, 400, and 500, may contain or consist of an electrically insulating material, for example an oxide, although other electrically insulating materials may be possible as well. Terminal electrodes of semiconductor devices, such as first terminal electrode 104 and/or second terminal electrode 105 of semiconductor devices 100, 150, 200, 300, 400, and 500, may contain or consist of an electrically conductive material such as, for example a metal or metal alloy, although other electrically conductive materials may be possible as well.

Furthermore, it may be understood that the doping types of the individual doped regions may be reversed to obtain devices of opposite conductivity type, for example p-type field effect transistors instead of n-type field effect transistors, or vice versa.

Semiconductor devices such as devices 100, 150, 200, 300, 400, and 500 may have a stripe-like pattern or structure. For example, additional electrodes 111 and/or gate electrodes 109 of device cells 120 may have a stripe-like pattern, as shown in FIG. 1B. However, it may be understood that semiconductor devices or device cells 120 of semiconductor devices may have differently shaped patterns or structures. For example, device cells 120 of semiconductor devices may have an arbitrary shape in general, for example a polygonal shape (e.g. triangular, quadrilateral, rectangular, square, hexagonal, or the like), a round shape (e.g. circular, elliptic, or the like), or an irregular shape.

In the following, reference will mainly be made to semiconductor devices, e.g. trench transistors, having electrodes made of polysilicon (also referred to as poly electrodes, or, short, polys) in the trench or trenches. However, it is to be understood that the same or similar considerations may also hold true for devices with electrodes containing or consisting of other electrically conductive materials such as, e.g., metals or metal alloys. Furthermore, dielectric or insulating layers in the trench(es) will mainly be described as oxides or oxide layers, e.g. field oxide (FOX) or gate oxide (GOX). However, it is to be understood that the same or similar considerations may also hold true for other dielectric or insulating materials.

Furthermore, although second terminal electrode 105 is shown as being disposed over the second side 107 of the semiconductor body 101, it may be understood that second terminal electrode 105 may also be disposed over the first side 106 of semiconductor body 101 (not shown). In this case, first subregion 103a of second terminal electrode region 103 may, for example, be configured as a buried layer and second terminal electrode 105 disposed over the first side 106 may be electrically connected to the buried layer by means of a vertical contact (e.g. contact trench) extending from the first side 106 as far as to the buried layer.

Trench transistors such as e.g. transistors 100, 150, 200, 300, 400, and 500 may be implemented as dense trench transistors. In one or more embodiments, the term "dense trench transistor" may include or refer to trench transistors having a high or very high integration density, for example including a large number (e.g. thousands, tens of thousands, hundreds of thousands, or millions, or even more) of transistor cells 120. In one or more embodiments, the term "dense trench transistor" may include trench transistors having a mesa width of less than or equal to about 1.5 times a trench width. The term "mesa width" may, for example, include or refer to a width of a region between two trenches of two adjacent device cells (e.g. width $w_m$ in FIG. 1A). The term "trench width" may, for example, include or refer to a width of a trench, in which the at least one additional electrode may be disposed (e.g. width $w_t$ in FIG. 1B). In one or more embodiments, the term "dense trench transistor" may include trench transistors having a mesa width of less than or equal to about 1.0 times the trench width. In one or more embodiments, the term "dense trench transistor" may include trench transistors, in which an electrical breakdown occurs at the trench bottom (in other words, in a region at or close to the bottom of the trench(es)).

Trench transistors may sometimes be operated in a so-called avalanche pulse mode. Dense trench transistors may incorporate hot charge carriers into the field dielectric (e.g. field oxide (FOX)), i.e. a dielectric layer (e.g. oxide layer) insulating a field plate of the transistor (e.g. second insulating layer 112 in semiconductor devices 100, 150, 200, 300, 400, and 500), (and/or into the gate dielectric (e.g. gate oxide (GOX)), i.e. a dielectric layer (e.g. oxide layer) insulating a gate electrode of the transistor (e.g. first insulating layer 110 in semiconductor devices 100, 150, 200, 300, 400) during each avalanche pulse. This may lead to undesired drifting of device parameters, for example breakdown voltage and/or starting voltage of the transistor, during repeated avalanche pulses (also referred to as repetitive avalanche applications). In principle, this drifting may also cause filamentation effects (wherein a transistor current may be concentrated on only one or a few cells having a lower breakdown voltage than the remaining cells), which may lead to premature destruction of the devices, which is illustrated in FIG. 6A.

Figure 6A:
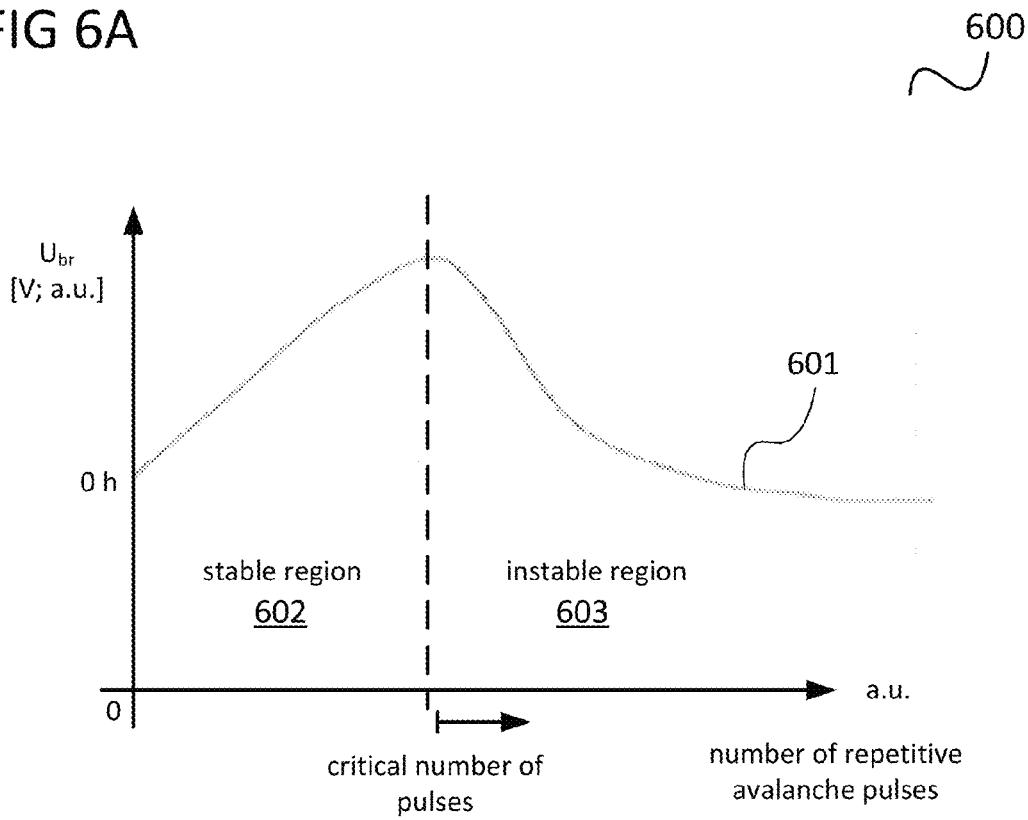
FIG. 6A shows a diagram illustrating a dependence of a trench transistor's breakdown voltage on a number of repetitive avalanche pulses.

FIG. 6A shows a diagram 600 plotting a trench transistor's breakdown voltage Ubr versus a number of repetitive avalanche pulses, as a curve 601.

It is shown that the breakdown voltage 601, starting from a so-called "zero hour" value, may initially rise (or drift) by a few volts with increasing number of avalanche pulses (see region 602). Region 602 may be seen as a stable operating region of the transistor. Then, after a critical number of avalanche pulses, the drifting direction of the breakdown voltage 601 may be reversed and the breakdown voltage 601 may decrease noticeably (see region 603). Region 603 may be seen as an operating region of the transistor, which may be unstable in principle. For a failure-free operation, it may be desirable that a transistor never reaches the falling region of the breakdown voltage 601 (region 603).

Figure 6B:
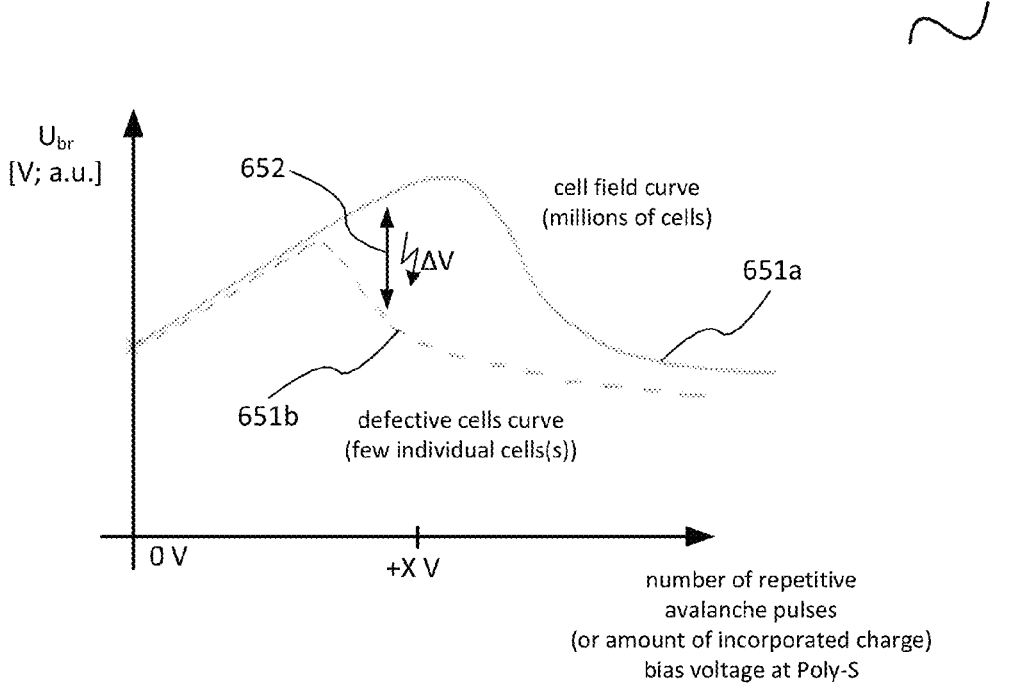
FIG. 6B shows a diagram illustrating a dependence of a breakdown voltage for non-defective transistor cells and defective transistor cells.

Another problem may occur when one or more individual transistor cells reach the falling mode significantly earlier than others, e.g. due to local faulty processing (defect density in e.g. trench or contact hole photo technique levels), as these (defective) cells may form local filaments, which may render the whole transistor unusable, which is illustrated in FIG. 6B.

FIG. 6B shows a diagram 650 plotting a breakdown voltage Ubr versus a number of repetitive avalanche pulses for two different types of transistor cells: a first curve 651a shows the breakdown voltage of normal (non-defective) cells (e.g. of a cell field including a large number (e.g. millions) of normal (non-defective) cells), while a second curve 651b shows the breakdown voltage of one or more (e.g. a few) defective transistor cells.

The term "defective cell" as used herein may, for example, include or refer to a cell that contains at least one defect or cell defect, for example a trench defect or contact trench defect. The term "non-defective cell" as used herein may, for example, include or refer to a cell that is free of defects.

The term "defect" as used herein may, for example, include or refer to a substantial deviation from a normal (or standard, or desired, or pre-determined) condition, state, shape and/or structure of a certain entity (e.g. element, structure, layer, etc.). For example, the term "trench defect" may include or refer to a substantial deviation of the shape or structure of a trench, or of one or more elements of the trench or in the trench, e.g. an electrode or dielectric in the trench. For example, the term "trench defect" may include a case, where a dimension (e.g. depth) of a trench substantially deviates from a desired dimension (e.g. depth), e.g. a trench depth that is too deep. Further, the term "trench defect" may include a case where a dimension of an element in a trench (e.g. a thickness of an insulating layer, e.g. gate dielectric (e.g. GOX), or field plate dielectric (e.g. FOX)) substantially deviates from a desired dimension (e.g. desired thickness), e.g. an oxide thickness that is too thin. Further, the term "trench defect" may include a case where an element in the trench, which was supposed to be present (e.g. an electrode, e.g. shield electrode, e.g. field plate), is actually missing, e.g. a missing poly electrode in the trench. Exemplary defects are also shown and described further below in connection with FIG. 9.

Defects as mentioned above may, for example, lead to a substantial deviation in the functionality, characteristics and/or behavior of the respective entity, compared with the functionality, characteristics or behavior of similar entities having no defects. For example, a defect in a transistor cell (e.g. trench defect, e.g. substantial thinning of a FOX) may lead to a substantial deviation in the transistor cell's behavior compared to other (non-defective) cells.

For example, as shown in FIG. 6B, the breakdown voltage 651b of defective transistor cell(s) may reach the falling region earlier (i.e. after a smaller number of avalanche pulses) than the breakdown voltage 651a of normal (non-defective) cell(s). This may lead to an increasing voltage difference ΔV (indicated by arrow 652) between the breakdown voltage of the defective cell(s) 651b and the breakdown voltage of the non-defective cells 651a. The higher this voltage difference 652 between the defective cell(s) and the remaining cell field becomes, the more critical the situation may become. Thus, if no further measures are taken, it may be possible that only relatively few avalanche pulses may be carried out with the transistor.

Therefore, it may be desirable to detect defective transistor cells during a pre-test of the transistor, for example in order to prevent defective devices from being delivered to customers.

Up to now, there are no reliable electrical detection methods to detect individual defective transistor cells, which may have formed as a result of trench defects or contact trench defects in trench transistors such as dual-poly trench transistors (i.e. trench transistors having two poly electrodes, namely a poly gate electrode (herein also referred to as Poly-G) and an additional poly electrode (herein also referred to as Poly-S or S-Poly) acting as a shield electrode and typically coupled with the transistor source during normal operation of the transistor, in order to filter out defective transistors. Structural inline detection methods may be very time-consuming and may show a reliable filtering only for defects of a certain minimum size, e.g. defects having a minimum size of at least 1 µm, for example significantly larger than 3 µm.

One or more embodiments may provide test methods and arrangements for testing semiconductor devices, in particular trench devices such as trench transistors (e.g. dense trench transistors, e.g. trench field effect transistors (FETs), e.g. trench MOSFETs, or trench insulated-gate bipolar transistors (IGBTs)) containing a plurality of device cells (e.g. transistor cells), to detect defective devices, for example devices having defects (e.g. trench defects) in one or more device cells. For example, trench transistors 100, 150, 200, 300, 400, and 500 described herein above may be seen as illustrative examples for semiconductor devices, to which test methods and/or test arrangements in accordance with one or more embodiments may be applied. However, as will be readily understood, test methods and/or test arrangements in accordance with one or more embodiments described herein may also apply to other trench devices, e.g. other trench transistors, for example trench transistors with three or more electrodes in one trench.

One or more embodiments may implement so-called defect density scans and/or reliability scans by providing corresponding test structures or arrangements and test methods, in which trench devices (such as trench transistors) having a plurality of electrodes (e.g. polysilicon electrodes (polys)), for example a gate electrode and one or more additional electrodes (e.g. a shield electrode, e.g. a field plate), in the trench may be electrically scanned for defects and/or quality of one or more trench dielectrics (e.g. oxides), for example the quality of a field oxide (FOX) and/or a gate oxide (GOX) and/or an inter-electrode oxide (e.g. oxide between two polys (POLOX)). Thus, in accordance with one or more embodiments, defective devices may be detected and filtered out at the end of the front end, e.g. on wafer level, so that it may, for example, be prevented that the defective products are delivered to a customer. In one or more embodiments, corresponding device (e.g. transistor) structures and/or pad structures and/or wiring structures and/or scan or test procedures may be provided, that may enable the aforementioned defect detection and/or filtering of defective devices or products.

One or more embodiments may provide structures or methods, which may allow for detecting and filtering out defective transistor cells, which may affect the breakdown voltage of the transistor. Thus, it may, for example, be possible to prevent defective devices from being delivered to customers.

Conventionally, dual-poly transistors may be internally connected in such a manner that the lower poly in the trench (field plate poly, or so-called "Poly-S"), e.g. electrode 111 in FIG. 1A, may be always at the source potential and may be, by means of the chip layout, directly connected with a power source metal pad via a contact hole.

In accordance with one or more embodiments, dual-poly transistors may be provided, in which the aforementioned field plate poly initially (e.g. up to and including front end measurements) may be led out separately to one or more pads that may be contacted separately. This may allow for general measurements or tests to be carried out in the front end (e.g. by means of probe cards, etc.), which may test the reliability of transistor cells and/or if or which transistor cells are affected by defects, before these separate pads may afterwards be connected with the source pad (or, more generally, with a pad that carries a desired or target potential) in the back end of line processing stage or in the back end assembling.

In one or more embodiments, connecting the separate pad(s) to the source pad (or, the pad carrying the target potential) may be achieved in a simple manner e.g. by means of wire bonding and/or clip bonding, and/or anti-fuse techniques and/or metal rewiring or redistribution techniques using material deposition or laser cut, and/or other suitable techniques. For example, in case that the separate pad(s) is/are connected to the large source pad of a power transistor in the back end of line processing stage or in the back end assembly, the final device or product may have the same potential characteristics and thus the same operating characteristics as a classical device or product.

One or more embodiments may include one or more of the following: a) disconnecting or undoing a direct contact of a poly electrode in a trench (e.g. Poly-S), b) providing a separate pad on a chip surface, c) forming a direct contact between the pad and the poly electrode in the trench, d) carrying out one or more defect scans and/or reliability tests e.g. in the front end (e.g. using one or more probes, e.g. a probe card), e) (optionally) evaluating data obtained by the test(s) by means of an evaluation scheme or algorithm such as dynamical PAT (part average testing) for filtering out systems that are defective or deviate from nominal values, f) (optionally) inking on wafer level and (optionally) delivering bare dies to customers, g) back end assembly, including formation of at least one conductive connection between the separate pad and a pad on the chip having a desired (target) potential (for example, connecting separate Poly-S pad with a power source pad on the chip for making contact to the source potential if the source potential is the desired potential, or (e.g. for high-speed or low-speed variants) connecting the separate Poly-S pad with a gate pad on the chip for making contact to the gate potential if the gate potential is the desired potential (in this case, the gate pad may, for example, be suitably enlarged), h) forming the aforementioned conductive connection (electrical contact) by means of bonding with one or more bond wires and/or a clip and/or anti-fuse techniques and/or metal rewiring or redistribution techniques using material deposition or laser cut and/or other suitable techniques, i) testing of the now restored normal transistor functions in the back end.

In one or more embodiments, a Poly-S voltage (in other words, a voltage applied to Poly-S electrodes) may be tuned during one or more low-current breakdown voltage measurements, such that various breakdown regimes may be tested (e.g. low-current parabola measurement). For example, the x-axis (i.e., axis pointing to the right) in diagram 650 of FIG. 6B may also represent the applied Poly-S bias voltage in a defect density scan, which (in the example shown in FIG. 6B) may detect a considerable deviation of the breakdown voltage Ubr from the nominal or desired value (represented by curve 651a) at a bias voltage of about +X volts (as shown) and may thus filter out the defective device. In other words, the occurrence of a deviation of the measured breakdown voltage from a nominal or desired breakdown voltage at a certain value (e.g. +X volts, as shown) of the Poly-S bias voltage may indicate that the tested device (or, one or more device cells) may include one or more defects.

In one or more embodiments, a FOX defect density stress test may be carried out, which may be similar to a GOX stress test. This may include gradually increasing a Poly-S potential with respect to all remaining potentials (e.g. potentials at source, drain and other gates of the transistor), which remain at ground (e.g. 0 V). For example, in accordance with one or more embodiments, a FOX defect density stress test may include applying a high potential to the Poly-S electrode, i.e. a potential which is high compared to the entire rest (which may be at ground, e.g. 0 V), in order to measure a tunnel current as a measure for a possibly defective thin part in the FOX, which may then be filtered out. In case of a particularly distinct thin part this may even lead to destruction of the FOX, so that the device (e.g. transistor) may then be filtered out with certainty. Alternatively, a voltage, which is negative compared to source, may be applied to the Poly-S electrode, and a positive voltage may simultaneously be applied to drain. Thus, in one or more embodiments, a trench bottom may be stressed more while a voltage may be reduced in a region of an oxide ramp, if necessary.

In one or more embodiments, a direct test of an inter-electrode dielectric (in other words, a dielectric layer between two electrodes in the trench), for example an oxide layer between two poly electrodes (herein also referred to as POLOX layer), may be carried out. For example, in accordance with some embodiments, Poly-G may be tested versus Poly-S. In other words, an inter-electrode dielectric between Poly-G and Poly-S may be tested for thin parts. The test procedure may be similar as in the FOX test, with the voltage being applied between the two electrodes (e.g. poly electrodes (polys), e.g. Poly-G and Poly-S) in the trench.

In one or more embodiments, two or three, or even more, electrodes (e.g. polys) in the trench may be tested in a similar manner as described above. In particular, an inter-electrode dielectric (e.g. inter-electrode oxide) between a respective electrode pair (e.g. poly pair) may be tested for thin parts.

In accordance with one or more embodiments, for example in case of high-speed or low-speed devices or products, electrodes (e.g. poly electrodes) in the trench, which may have the same potential in the final product, may be tested against each other.

In accordance with one or more embodiments, the test described herein may also be applied to sensor structures or devices.

In accordance with one or more embodiments, a Poly-S may (still) be separately bonded on product level. In this case, if a suitable Poly-S voltage is applied, pulsed high-current single or repetitive avalanche tests may be carried out, which may be very sensitive to defects, which may be, for example, not noticeable at all in conventional single avalanche tests (where Poly-S voltage=0 V). This may be a further way to filter or sort out defective devices or components by means of measurement. In the product, the required Poly-S potential or voltage may, for example, be applied in a circuitry-wise manner, or via fuses, zap diodes, or other suitable ways. This may also have the effect that devices or components may be analyzed with respect to their defect characteristics, after avalanche stress, annealing, or other stress tests.

An aspect of test arrangements and methods in accordance with one or more embodiments may be seen in that an arbitrary trench, which may carry an arbitrary electrical potential in the final product, may be tested for various reliability criteria (such as dielectric layer (e.g. oxide) thickness or breakdown voltage) in an intermediate stage. By using a suitable arrangement, also a semiconductor region between two or more selected trenches (e.g. a drift zone, an accumulation zone, etc.) may be tested in accordance with one or more embodiments. For example, a defect scan similar to a tomography of a human being may be possible by using separately controllable electrodes and varying various potentials (e.g. continuously) within predeterminable value ranges. Separate controlling of the electrode potentials may, for example, be achieved by providing one or more additional pads, which may be coupled to the respective electrodes.

In one or more embodiments, a shield electrode (e.g. field plate poly) may be not directly connected to a source pad via one or more contact holes, but at least one bond wire (or other connection structures) may be involved in establishing the electrical connection. For example, an electrode (e.g. poly), or also a semiconductor region, to be tested may be located structurally completely separate or isolated from the remaining chip construction and may be connected with the remaining chip construction by means of one or more electrical connections added afterwards (e.g. only after testing).

FIG. 7A shows a test method 700 according to various embodiments.

In 702, a semiconductor device to be tested may be provided. The semiconductor device may include at least one device cell. The at least one device cell may include at least one trench, at least one first terminal electrode region and at least one second terminal electrode region, at least one gate electrode, and at least one additional electrode disposed at least partially in the at least one trench. An electrical potential of the at least one additional electrode may be controlled separately from electrical potentials of the at least one first terminal electrode region, the at least one second terminal electrode region and the at least one gate electrode. For example, the at least one additional electrode may be electrically disconnected or insulated from the at least one first terminal electrode region, the at least one second terminal electrode region and the at least one gate electrode.

In 704, at least one electrical test potential may be applied to at least the at least one additional electrode to detect defects in the at least one device cell.

In one or more embodiments, the semiconductor device may be formed in or may be part of a semiconductor workpiece, for example a wafer or a chip.

In one or more embodiments, the semiconductor workpiece may include at least one pad, for example a plurality of pads. In one or more embodiments, the semiconductor workpiece may include at least one first pad electrically connected to the at least one first terminal electrode region. In one or more embodiments, the semiconductor workpiece may include at least one second pad electrically connected to the at least one second terminal electrode region. In one or more embodiments, the semiconductor workpiece may include at least one third pad electrically connected to the at least one gate electrode. In one or more embodiments, the semiconductor workpiece may include at least one fourth pad electrically connected to the at least one additional electrode.

In one or more embodiments, the semiconductor workpiece may include at least one separate pad assigned to the at least one additional electrode. Thus, a potential of the at least one additional electrode may be controlled separately from potentials of other electrodes. In other words, the potential of the at least one additional electrode may be changed without changing potentials of other electrodes or electrode regions (e.g. gate electrode potential, and/or source/drain potential).

In one or more embodiments, the pads may be separate pads. In one or more embodiments, the pads may be electrically disconnected from one another.

In one or more embodiments, at least one of the pads may include or may consist of an electrically conductive material, for example a metal or metal alloy.

In one or more embodiments, at least one of the pads may be disposed at or over a front side of the semiconductor workpiece. In one or more embodiments, at least one of the pads may be disposed at or over a back side of the semiconductor workpiece.

In one or more embodiments, the semiconductor workpiece may include a semiconductor body, wherein the at least one trench may be formed in or extend into the semiconductor body.

In one or more embodiments, the semiconductor body may include or consist of silicon, although other semiconductor materials, including compound semiconductor materials, may be used in accordance with other embodiments.

In one or more embodiments, the at least one test potential may be configured to detect trench defects in the at least one device cell.

In one or more embodiments, the semiconductor device may include a plurality of device cells, for example hundreds of device cells, or thousands of device cells, or ten thousands of device cells, or hundreds of thousands of device cells, or millions of device cells, or even more device cells. In one or more embodiments, the device cells may be configured or arranged as a cell field.

In one or more embodiments, the plurality of device cells may all be configured substantially in the same way, for example may all have substantially the same structure, for example may all have substantially the same elements or regions.

In one or more embodiments, the at least one electrical potential may be applied to at least part of the cells simultaneously.

In one or more embodiments, the at least one electrical potential may be applied to all cells simultaneously.

In one or more embodiments, the at least one electrical potential may be applied to at least one common electrode connected to all cells.

In one or more embodiments, the at least one electrical test potential may be configured to detect defects in the plurality of device cells, for example trench defects and/or contact trench defects.

In one or more embodiments, the at least one electrical test potential may be configured to detect one or more defective device cells among the plurality of device cells of the semiconductor device.

In one or more embodiments, the first terminal electrode region may be configured to receive a first power supply potential during normal operation of the semiconductor device, for example a lower power supply potential or an upper power supply potential, e.g. a source/drain potential, e.g. a source potential, or an emitter/collector potential, e.g. an emitter potential.

In one or more embodiments, the second terminal electrode region may be configured to receive a second power supply potential during normal operation of the semiconductor device, for example an upper power supply potential or a lower power supply potential, e.g. a source/drain potential, e.g. a drain potential, or an emitter/collector potential, e.g. a collector potential.

In one or more embodiments, the semiconductor device may be configured as a transistor, for example as a field-effect transistor (FET), e.g. a MOSFET (e.g. NMOS or PMOS), or as a bipolar transistor, e.g. an insulated-gate bipolar transistor (IGBT).

In one or more embodiments, the at least one first terminal electrode region may include or be a first source/drain region, for example a source region or a drain region.

In one or more embodiments, the at least one second terminal electrode region may include or be a second source/drain region, for example a drain region or a source region.

In one or more embodiments, the at least one first terminal electrode region may include or be a first emitter/collector region, for example an emitter region or a collector region.

In one or more embodiments, the at least one second terminal electrode region may include or be a second emitter/collector region, for example a collector region or an emitter region.

In one or more embodiments, the transistor may be configured as a trench transistor.

In one or more embodiments, the transistor may be configured as a power transistor.

In one or more embodiments, the at least one gate electrode may be configured to control a switching state of the semiconductor device, e.g. a switching state of the transistor.

In one or more embodiments, the at least one gate electrode may be disposed at least partially in the at least one trench.

In one or more embodiments, the at least one gate electrode and the at least one additional electrode may be disposed at least partially in the at least one trench.

In one or more embodiments, the at least one gate electrode and the at least one additional electrode may be disposed in the same trench. In one or more embodiments, the at least one gate electrode may be disposed in an upper portion of the trench and the at least one additional electrode may be disposed in a lower portion of the trench below the at least one gate electrode. In one or more embodiments, the at least one gate electrode and the at least one additional electrode in the trench may be insulated from one another, for example by means of an insulating layer or inter-electrode dielectric, for example an oxide layer.

In one or more embodiments, the at least one gate electrode and the at least one additional electrode may be disposed laterally next to each other in the at least one trench. In one or more embodiments, the at least one additional electrode may extend deeper in the trench than the gate electrode.

In one or more embodiments, the at least one gate electrode and the at least one additional electrode may be disposed in different trenches.

In one or more embodiments, the at least one cell may include at least one first trench and at least one second trench, wherein the at least one additional electrode may be disposed in the at least one first trench and the at least one gate electrode may be disposed in the at least one second trench.

In one or more embodiments, the at least one gate electrode may be disposed over the semiconductor body, for example over a front side of the semiconductor body.

In one or more embodiments, the at least one gate electrode may be insulated from the semiconductor body. In one or more embodiments, the semiconductor device may include at least one first insulating layer to insulate the at least one gate electrode. In one or more embodiments, the at least one first insulating layer may at least partially surround the at least one gate electrode. In one or more embodiments, the at least one first insulating layer may include or consist of an oxide. In accordance with other embodiments, the at least one first insulating layer may contain or consist of other insulating materials.

In one or more embodiments, the at least one additional electrode may be configured as a shield electrode, for example as a field plate.

In one or more embodiments, the at least one additional electrode may be insulated from the semiconductor body and/or the gate electrode. In one or more embodiments, the semiconductor device may include at least one second insulating layer to insulate the at least one additional electrode. In one or more embodiments, the at least one second insulating layer may be disposed in the at least one trench. In one or more embodiments, the at least one second insulating layer may at least partially surround the at least one additional electrode. In one or more embodiments, the at least one second insulating layer may include or consist of an oxide. In accordance with other embodiments, the at least one second insulating layer may contain or consist of other insulating materials.

In one or more embodiments, the at least one gate electrode may include or may consist of an electrically conductive material, for example polysilicon or a metal or metal alloy, although electrically conductive materials may be used in accordance with other embodiments.

In one or more embodiments, the at least one additional electrode may include or may consist of an electrically conductive material, for example polysilicon or a metal or metal alloy, although electrically conductive materials may be used in accordance with other embodiments.

In one or more embodiments, the semiconductor device may include or be configured in accordance with one or more features described in connection with one or more of semiconductor devices 100, 150, 200, 300, 400, and 500.

In one or more embodiments, applying at least one test potential to at least the at least one additional electrode may include applying a plurality of test potentials to the at least one additional electrode, for example a sequence of increasing test potentials (in other words, a sequence of test potentials, each test potential having a fixed magnitude, and the magnitudes increasing from test potential to test potential, i.e. V1<V2<V3< . . . <Vn−1<Vn, with Vi being the i-th potential of the sequence), or a sequence of decreasing test potentials (in other words, a sequence of test potentials, each test potential having a fixed magnitude, and the magnitudes decreasing from test potential to test potential, i.e. V1>V2>V3> . . . >Vn−1>Vn, with Vi being the i-th potential of the sequence).

In one or more embodiments, applying at least one test potential to at least the at least one additional electrode may include applying a plurality of different test potentials to the at least one additional electrode while applying a fixed potential (for example, ground potential, e.g. 0 V) to the at least one gate electrode, the at least one first terminal electrode region and the at least one second terminal electrode region. For example, applying at least one test potential to at least the at least one additional electrode may include ramping up a potential at the at least one additional electrode while maintaining the potentials of the at least one first terminal electrode region, the at least one second terminal electrode region and the gate electrode at a fixed value, e.g. ground, e.g. 0 V.

In one or more embodiments, the method may include applying the at least one test potential to at least the at least one additional electrode and measuring a tunnel current through the at least one second insulating layer. In other words, the at least one test potential may be configured to measure a tunnel current through the at least one second insulating layer.

In one or more embodiments, the method may include applying the at least one test potential to at least the at least one additional electrode and determining a breakdown voltage of the semiconductor device. In other words, the at least one test potential may be configured to determine a breakdown voltage of the semiconductor device.

In one or more embodiments, applying the at least one test potential to at least the at least one additional electrode may include carrying out one or more breakdown voltage measurements, for example low-current breakdown voltage measurements, with varying bias voltages at the at least one additional electrode, e.g. a low-current parabola measurement. In one or more embodiments, the bias voltage may be varied (e.g. ramped) from a lower bias voltage to an upper bias voltage, which is higher than the lower bias voltage. In one or more embodiments, the lower bias voltage may be about −20 V and the upper bias voltage may be about +50 V. In one or more embodiments, the lower bias voltage may be about −5 V and the upper bias voltage may be about +25 V. In one or more embodiments, the lower bias voltage may be about 0 V and the upper bias voltage may be about +12 V.

In one or more embodiments, each breakdown voltage measurement (i.e., for each value of the bias voltage at the at least one additional electrode) may include ramping up a potential at the at least one second terminal electrode region (e.g. drain region) while applying a fixed potential (e.g. ground potential, e.g. 0 V) to the at least one gate electrode and the at least one first terminal electrode region (e.g. source region), and measuring an electric current flowing between the at least one first terminal electrode region (e.g. source region) and the at least one second terminal electrode region (e.g. drain region). The potential at the at least one second terminal electrode region (e.g. drain region) may, for example, be ramped up starting from a lower value $U_{lower}$ (e.g. 0 V) until a desired value of the electric current (e.g. 1 mA) is measured at some upper value $U_{upper}$ of the potential. The difference between the potential $U_{upper}$ at the at least one second terminal electrode region and the potential at the at least one first terminal electrode region (e.g. ground potential, e.g. 0 V) may then indicate the breakdown voltage Ubr corresponding to the respective bias voltage at the at least one additional electrode. By carrying out breakdown voltage measurements for a number of different bias voltages at the at least one additional electrode, the dependence of the breakdown voltage on the bias voltage may be determined, which may, for example, look similar to one of the curves shown in FIG. 6A and FIG. 6B.

In one or more embodiments, at least one of the at least one first terminal electrode region and the at least one second terminal electrode region may include or be configured as a contact trench region.

In one or more embodiments, the at least one test potential may be configured to detect one or more defects in the contact trench region or regions.

In one or more embodiments, applying the at least one test potential to at least the at least one additional electrode may include subjecting the semiconductor device to at least one of a defect density scan and a reliability scan.

In one or more embodiments, applying the at least one test potential to at least the at least one additional electrode may include subjecting the semiconductor device to a field oxide (FOX) stress test.

In one or more embodiments, applying at least one test potential to at least the at least one additional electrode may include forcing a predeterminable electrical current through the semiconductor device (e.g. transistor). The electrical current may have a constant or substantially constant current density. For example, the current density of the electrical current may be held constant or substantially constant for a predeterminable time period.

In one or more embodiments, the current density may be greater than or equal to about 0.5 A/mm$^2$ (amps per mm$^2$ of active device area), for example greater than or equal to about 10 A/mm$^2$, for example greater than or equal to about 50 A/mm$^2$, for example greater than or equal to about 100 A/mm$^2$. In one or more embodiments, the current density may be near a destruction limit of the device (e.g. transistor).

In one or more embodiments, applying at least one test potential to at least the at least one additional electrode may include carrying out an avalanche test.

In one or more embodiments, the avalanche test may include applying one or more avalanche pulses to the semiconductor device. In other words, the avalanche test may be a pulsed avalanche test.

In one or more embodiments, the method may further include analyzing test results obtained from testing the semiconductor device. In one or more embodiments, analyzing or evaluating the test results may include or be achieved by an evaluation scheme or algorithm such as dynamical part average testing (PAT).

In one or more embodiments, applying the at least one test potential to at least the at least one additional electrode may include or may be carried out using one or more probes, for example using a probe card including one or more probes. The probes may, for example, contact one or more contact pad(s) connected to the at least one first and second terminal electrode regions, the at least one gate electrode, and the at least one additional electrode.

In one or more embodiments, applying the at least one test potential to at least the at least one additional electrode may be carried out during or at the end of a front end processing stage.

In one or more embodiments, the at least one additional electrode may be electrically connected to the at least one first terminal electrode region (e.g. source region), or to the at least one gate electrode, after applying the at least one test potential, for example after carrying out one or more of the tests described herein. Connecting the at least one additional electrode to the at least one first terminal electrode region or to the at least one gate electrode may, for example, be achieved by forming an electrical connection between respective pads, e.g. between a pad coupled to the at least one additional electrode and a pad coupled to the at least one first terminal electrode region (e.g. source pad) or a pad coupled to the at least one gate electrode (gate pad).

In one or more embodiments, the semiconductor device may have a surface area (e.g. chip area) of greater than or equal to about 1 mm$^2$, for example greater than or equal to about 2 mm$^2$, for example greater than or equal to about 5 mm$^2$, for example greater than or equal to about 10 mm$^2$, for example greater than or equal to about 20 mm$^2$.

FIG. 7B shows a test method 750 according to various embodiments.

In 752, a workpiece may be provided. The workpiece may include a transistor to be tested. The transistor may include a plurality of cells electrically connected in parallel. Each cell may include at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode.

In 754, a plurality of test potentials may be applied to at least the at least one additional electrode of the cells to detect defective cells among the plurality of cells.

Method 750 may further be configured in accordance with one or more embodiments described herein.

Test methods in accordance with one or more embodiments, for example method 700 and/or method 750, may, for example, be carried out by a test arrangement such as test arrangement 800' shown in FIG. 8.

FIG. 8 shows a test arrangement 800' in accordance with various embodiments.

Test arrangement 800' may include a semiconductor device 800 to be tested. Semiconductor device 800 may include at least one device cell 120. The at least one device cell 120 may include at least one trench 130. The at least one device cell 120 may further include at least one first terminal electrode region 102. The at least one device cell 120 may further include at least one second terminal electrode region 103. The at least one device cell 120 may further include at least one gate electrode 109. The at least one device cell 120 may further include at least one additional electrode 111. The at least one additional electrode 111 may be disposed at least partially in the at least one trench 130. An electrical potential of the at least one additional electrode 111 may be controlled separately from electrical potentials of the at least one first terminal electrode region 102, the at least one second terminal electrode region 103 and the at least one gate electrode 109.

Test arrangement 800' may further include a test device 850. Test device 850 may be configured to apply at least one electrical test potential to at least the at least one additional electrode 111 to detect defects in the at least one device cell 120.

In one or more embodiments, test device 850 may be electrically coupled or connected to semiconductor device 800, for example by means of one or more electrical connections 851, 852, 853, 854.

For example, test device 850 may be coupled to the at least one first terminal electrode region 102 via a first electrical connection 851. In one or more embodiments, first electrical connection 851 may, for example, include an electrical connection between test device 850 and a first pad (e.g. first chip pad, e.g. a source pad) of semiconductor device 800 coupled to the at least one terminal electrode region 102 (or to a first terminal electrode coupled to the at least one terminal electrode region 102).

For example, test device 850 may be coupled to the at least one second terminal electrode region 103 via a second electrical connection 852. In one or more embodiments, second electrical connection 852 may, for example, include an electrical connection between test device 850 and a second pad (e.g. second chip pad, e.g. drain pad) of semiconductor device 800 coupled to the at least one second terminal electrode region 102.

For example, test device 850 may be coupled to the at least one gate electrode 109 via a third electrical connection 853. In one or more embodiments, third electrical connection 853 may, for example, include an electrical connection between test device 850 and a third pad (e.g. third chip pad, e.g. gate pad) of semiconductor device 800 coupled to the at least one gate electrode 109.

For example, test device 850 may be coupled to the at least one additional electrode 111 via a fourth electrical connection 854. In one or more embodiments, fourth electrical connection 854 may, for example, include an electrical connection between test device 850 and a fourth pad (e.g. fourth chip pad) of semiconductor device 800 coupled to the at least one additional electrode 111.

In one or more embodiments, semiconductor device 800 may be formed in or be part of a chip or wafer. In one or more embodiments, at least one of the pads may be disposed over a front side of the chip or wafer. In one or more embodiments, at least one of the pads may be disposed over a back of the chip or wafer.

In one or more embodiments, semiconductor device 800 may be configured as a transistor, for example as a field effect transistor (FET), e.g. MOSFET, or as a bipolar transistor, e.g. an insulated-gate bipolar transistor (IGBT).

Semiconductor device 800, or one or more elements of semiconductor device 800 may, for example, be further configured in accordance with one or more embodiments described herein, for example in accordance with one more embodiments described in connection with method 700, and/or in accordance with one or more features described in connection with one or more of semiconductor devices 100, 150, 200, 300, 400, and 500.

In one or more embodiments, test device 850 may include or may be a test circuit. In one or more embodiments, test device 850 may include or may be test equipment. In one or more embodiments, test device 850 may include one or more probes, for example a probe card including one or more probes. The probe(s) or probe card may, for example, serve to contact one or more pads electrically connected with one or more electrodes or electrode regions of semiconductor device 800, for example one or more of first to fourth pads described above.

In one or more embodiments, test device 850 may be configured to perform one or more tests or test methods in accordance with one or more embodiments described herein, for example a defect density scan and/or a reliability scan. To this end, test device 850 may be configured to apply one or more, e.g. a plurality of, test potentials to at least the at least one additional electrode 111. In one or more embodiments, test device 850 may, for example, be configured to apply a sequence of increasing or decreasing potentials to at least the at least one additional electrode 111. In one or more embodiments, test device 850 may, for example, be configured to force a predeterminable electric current through semiconductor device 800. In one or more embodiments, test device 850 may, for example, be configured to carry out an avalanche test, e.g. a pulsed avalanche test.

In one or more embodiments, test device 850 may be configured to evaluate test results obtained (e.g. measured breakdown voltages), for example by using an evaluation scheme or algorithm such as e.g. part average testing (PAT).

FIG. 9 shows a semiconductor device 900 having various cell defects, and further shows an electrical scan curve, for illustrating aspects of one or more embodiments.

Semiconductor device 900 may include a plurality of device cells 120. Each cell may include a trench 130. The trenches 130 may be formed within or extend into a semiconductor body 101. The trenches 130 may be configured to include a gate electrode 109 and an additional electrode 111 disposed in the respective trench 130. Gate electrode 109 may be insulated by a first insulating layer (e.g. gate oxide (GOX)), and additional electrode 111 may be insulated by a second insulating layer (e.g. field oxide (FOX)). Gate electrode 109 may serve to control a switching state of semiconductor device 900, while the additional electrode 111 may, for example, serve as a shield electrode to reduce an electric field intensity at the gate dielectric 110 insulating the gate electrode 109. A contact trench 115 may in each case be disposed between two neighboring trenches 130. Semiconductor device 900 may include further elements, for example first terminal electrode regions (e.g. source regions) disposed between the contact trenches 115 and the trenches 130, or at least one second terminal electrode region, and/or other elements (not shown for sake of clarity).

Three different cell defects 901, 902, 903 are shown as an example. A first cell defect may be a defect in a trench 130, namely that a thickness of the second insulating layer (e.g. FOX) insulating the additional electrode 111 substantially deviates from a desired thickness, in particular a considerable thinning of the second insulating layer (e.g. FOX) e.g. at the bottom of the trench 130, as indicated by encircled region 901. A second cell defect may be another defect of a trench 130, namely that the additional electrode 111 is missing in the trench 130, as indicated by encircled region 902. A third cell defect may be a defect of a contact trench 115, namely that a depth of the contact trench 115 is too deep, as illustrated by encircled region 903.

Cell defects 901, 902, and/or 903 may lead to a substantial deviation in the behavior of the corresponding cell or cells 120 compared to other (non-defective) cells 120, which may have a negative impact on the performance of semiconductor device 900, or may even render semiconductor device 900 unusable, as described above.

Test methods and/or test arrangements in accordance with one or more embodiments described herein may be able to detect defective cells having one or more cell defects, such as e.g. cell defects 901, 902, and/or 903 (or other defects), such that devices having defective cells may, for example, be filtered out.

In one or more embodiments, detection of defective cells may be carried out by applying one or more test potentials to the device cells 120, or to one or more electrodes or electrode regions of the cells 120, for example to carry out breakdown voltage measurements and/or dielectric layer stress tests, etc.

For example, in one or more embodiments, testing may include or be achieved by varying a bias potential at the at least one additional electrode 111 of semiconductor device 900 between a first value (e.g. 0 V) and a second value (e.g. some predeterminable upper limit), e.g. increasing the bias potential from the first value to the second value, and carrying out a low-current breakdown voltage measurement for each of the applied bias potentials. A deviation of the measured breakdown voltage from a nominal or desired value at some value of the bias potential may then, for example, indicate that semiconductor device 900 may have one or more defective cells.

For example, in accordance with one or more embodiments, an electrical scan curve may illustratively be pushed through the cell(s) 120 to detect anomalies (defects) 901, 902, 903 in semiconductor device 900, as illustrated in FIG. 9.

FIG. 9 shows (in the left half of the figure) the electrical push-through (indicated by arrows 920) of the scan curve for the case of additional electrode(s) 111 (e.g. Poly-S electrode(s)) being at a first bias potential, e.g. 0 V, (represented by first potential curve 910a in the trench bottom area) and the case of electrode(s) 111 being at a second bias potential, e.g. +12 V, (represented by second potential curve 910b in the inter-electrode dielectric layer (e.g. POLOX) area). Illustratively, curves 910a and 910b may represent electrical potential lines in semiconductor device 900 for two different values of the bias potential at the electrode(s) 111 (i.e., 0 V and +12 V) and a given value of the potential at the first terminal electrode regions (e.g. 0 V) and a given value of the potential at the second terminal electrode region (e.g. +30 V or +40 V). The electrical scan curve may be pushed from bottom to top into the cell(s) 120 according to the bias voltage applied to additional electrode(s) 111 (e.g. Poly-S electrode(s)). Anomalies (defects) 901, 902, 903 in the various cells 120 of semiconductor device 900 may be detected at low current densities as they may cause a different shape of the potential curve and thus a different value of the breakdown voltage Ubr. In one or more embodiments, a dynamical PAT evaluation algorithm may be applied to the Ubr distribution and may filter out anomalous (defective) devices (e.g. chips).

FIG. 10 shows a cross-sectional view of another exemplary semiconductor device 1000 for use with one or more embodiments.

Semiconductor device 1000 may be to some degree similar to semiconductor device 100 described above. In particular, reference numerals which are the same as there may denote the same or similar elements, which will thus not be described in detail again here.

Semiconductor device 1000 differs from semiconductor device 100 in that semiconductor device 1000 is configured as a diode. First terminal electrode regions 102 may be of the same conductivity type as body regions 108 and may be of the opposite conductivity type as second terminal electrode region 103. For example, first terminal electrode regions 102 may be p-doped (e.g. p+ doped) while second terminal electrode region 103 may be n-doped, including for example highly n-doped (e.g. n+ doped) first subregion 103a and lightly n-doped (e.g. n− doped) second subregion 103b. It may be understood that the conductivity type of all doped regions may be reversed. First terminal electrode regions 102 may be anode regions and first terminal electrode 104 may be an anode of the diode, while second terminal electrode region 103 may be a cathode region and second terminal electrode 105 may be a cathode of the diode, or vice versa.

Each device cell 120 of semiconductor device 1000 may include at least one trench 130. An electrode 1011 may be disposed in the trench 130 and may be electrically insulated from the semiconductor body 101 by means of an electrically insulating layer 1012 that may surround the electrode 1011. The electrodes 1011 may extend along body regions 108 and along at least part of the second terminal electrode region 103 (e.g., at least part of the second subregion 103b of the second terminal electrode region 103, as shown). The electrodes 1011 may be electrically connected to one another. The electrodes 1011 may contain or consist of an electrically conductive material such as, for example, polysilicon or a metal or metal alloy, but other electrically conductive materials may be used as well. The electrically insulating layer 1012 may contain or consist of an electrically insulating material such as, for example, an oxide, but other electrically insulating materials may be used as well.

FIG. 11 shows a test method 1100 according to various embodiments.

In 1102, a semiconductor device to be tested may be provided. The semiconductor device may be configured as a diode. The semiconductor device may include at least one device cell. The at least one device cell may include at least one trench, at least one first terminal electrode region and at least one second terminal electrode region, and at least one electrode disposed at least partially in the at least one trench. An electrical potential of the at least one electrode may be controlled separately from electrical potentials of the at least one first terminal electrode region and the at least one second terminal electrode region. For example, the at least one electrode may be electrically disconnected or insulated from the at least one first terminal electrode region and the at least one second terminal electrode region.

In 1104, at least one electrical test potential may be applied to at least the at least one electrode to detect defects in the at least one device cell.

In one or more embodiments, the semiconductor device may further include or be configured in accordance with one or more features described herein above in connection with semiconductor device 1000.

In one or more embodiments, the semiconductor device configured as a diode may be subjected to one or more of the test methods or tests described herein above to detect defects in the at least one device cell, for example a defect density scan, a reliability scan, an electrode insulating layer stress test, a breakdown voltage measurement, and/or an avalanche test, by applying at least one electrical test potential to at least the at least one electrode in a similar manner as described herein above. To this end, it may be provided that the at least one electrode disposed in the at least one trench may be electrically disconnected from the first and second terminal electrode regions and may, for example, be coupled to a separate pad, as described herein above. In one or more embodiments, the separate pad may later (e.g. after the test or tests have been carried out) be coupled to another pad carrying a desired potential during normal operation of the semiconductor device, as described herein above.

Illustratively, the semiconductor device configured as a diode and having at least one electrode disposed in a trench may be subjected to the same or similar tests as the semiconductor devices described herein having at least one gate electrode and having at least one additional electrode disposed in a trench. For example, a test arrangement in accordance with one or more embodiments, including the semiconductor device to be tested (i.e. the diode in this case) and the test device (e.g. test circuit or test equipment), may be configured in the same or a similar manner as the test arrangement 800' described herein above in connection with FIG. 8, except that the gate electrode 109 and consequently the electrical connection 853 are missing.

A test method in accordance with various embodiments may include: providing a semiconductor device to be tested, the semiconductor device including at least one device cell, the at least one device cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and applying at least one electrical test potential to at least the at least one additional electrode to detect defects in the at least one device cell.

In one or more embodiments, the semiconductor device may have a surface area (e.g. chip area) of greater than or equal to about 1 mm$^2$, for example greater than or equal to about 2 mm$^2$, for example greater than or equal to about 5 mm$^2$, for example greater than or equal to about 10 mm$^2$, for example greater than or equal to about 20 mm$^2$.

In one or more embodiments, the semiconductor device may be configured as a transistor.

In one or more embodiments, the at least one gate electrode may be disposed at least partially in the at least one trench.

In one or more embodiments, the at least one additional electrode may be configured as a shield electrode.

In one or more embodiments, the at least one test potential may be configured to detect one or more defects in the at least one trench.

In one or more embodiments, the at least one cell may include at least one contact trench, and the at least one test potential may be configured to detect one or more defects in the at least one contact trench.

In one or more embodiments, the at least one test potential may be configured to determine a breakdown voltage of the semiconductor device.

In one or more embodiments, applying at least one test potential to at least the at least one additional electrode may include forcing a predeterminable electrical current through the semiconductor device (e.g. transistor). The electrical current may have a constant or substantially constant current density. For example, the current density of the electrical current may be held constant or substantially constant for a predeterminable time period.

In one or more embodiments, the current density may be greater than or equal to about 0.5 A/mm$^2$ (amps per mm$^2$ of active device area, for example greater than or equal to about 10 A/mm$^2$, for example greater than or equal to about 50 A/mm$^2$, for example greater than or equal to about 100 A/mm$^2$. In one or more embodiments, the current density may be near a destruction limit of the device (e.g. transistor).

In one or more embodiments, applying at least one test potential to at least the at least one additional electrode may include carrying out an avalanche test.

In one or more embodiments, the avalanche test may include applying one or more avalanche pulses to the semiconductor device. In other words, the avalanche test may be a pulsed avalanche test.

In one or more embodiments, applying at least one test potential to at least the at least one additional electrode may include applying a plurality of test potentials to the at least one additional electrode, and the method may further include measuring a breakdown voltage of the semiconductor device for each of the plurality of test potentials.

In one or more embodiments, the at least one test potential may be configured to determine a strength of an insulating layer in the at least one trench.

In one or more embodiments, the at least one additional electrode may be insulated by an insulating layer disposed in the at least one trench, wherein applying at least one test potential to at least the at least one additional electrode may include applying a plurality of test potentials to the at least one additional electrode, and wherein the method may further include: measuring a tunnel current through the insulating layer for each of the plurality of test potentials.

In one or more embodiments, at least one of the at least one gate electrode and the at least one additional electrode may include polysilicon.

In one or more embodiments, the semiconductor device may include a plurality of device cells electrically connected in parallel, each device cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode, wherein the at least one test potential may be applied to all device cells of the plurality of device cells simultaneously.

In one or more embodiments, applying the at least one test potential may include subjecting the semiconductor device to at least one of a defect density scan and a reliability scan.

In one or more embodiments, the method may further include analyzing test results obtained by applying the at least one test potential, by means of dynamical part average testing (PAT).

In one or more embodiments, the semiconductor device may be formed in a semiconductor workpiece, the workpiece including a plurality of pads including at least a first pad coupled to the at least one first terminal electrode region, a second pad coupled to the at least one second terminal electrode region, a third pad coupled to the at least one gate electrode and a fourth pad coupled to the at least one additional electrode, wherein the fourth pad coupled to the at least one additional electrode may be electrically insulated from the first to third pads.

In one or more embodiments, the method may further include: electrically connecting the fourth pad to at least one of the first to third pads after applying the at least one test potential to at least the at least one additional electrode.

In one or more embodiments, electrically connecting the fourth pad to at least one of the first to third pads may be carried out in a back end of line processing stage of the semiconductor device. In one or more embodiments, electrically connecting the fourth pad to at least one of the first to third pads may be carried out in a back end processing stage of the semiconductor device.

In one or more embodiments, applying the at least one test potential to at least the at least one additional electrode may include using a plurality of probes.

In one or more embodiments, applying the at least one test potential to at least the at least one additional electrode may be carried out in a front end processing stage of the semiconductor device.

A test method in accordance with various embodiments may include: providing a workpiece, the workpiece including a transistor to be tested, the transistor including a plurality of cells electrically connected in parallel, each cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and applying a plurality of test potentials to at least the at least one additional electrode of the cells to detect defective cells among the plurality of cells.

In one or more embodiments, applying the plurality of test potentials to at least the at least one additional electrode of the cells may include applying a plurality of different bias potentials to the at least one additional electrode, wherein the method may further include measuring a breakdown voltage of the transistor for each of the bias potentials.

In one or more embodiments, the at least one additional electrode may be insulated by an insulating layer disposed in the respective trench, wherein applying the plurality of test potentials to at least the at least one additional electrode may include applying a plurality of test potentials to the at least one additional electrode, and wherein the method may further include measuring a tunnel current through the insulating layer for each of the plurality of test potentials.

In one or more embodiments, the workpiece may further include a plurality of pads including at least a first pad coupled to the at least one first terminal electrode region, a second pad coupled to the at least one second terminal electrode region, a third pad coupled to the at least one gate electrode and a fourth pad coupled to the at least one additional electrode of each cell, wherein the fourth pad coupled to the at least one additional electrode may be electrically insulated from the first to third pads.

In one or more embodiments, applying the plurality of test potentials to at least the at least one additional electrode of the cells may be carried out in a front end processing stage of the workpiece; and the method may further include electrically connecting the fourth pad to at least one of the first to third pads in a back end of line or a back end processing stage of the workpiece.

A test arrangement in accordance with various embodiments may include: a semiconductor device to be tested, the semiconductor device including at least one device cell, the at least one device cell including at least one trench, at least one first terminal electrode region, at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and a test device configured to apply at least one electrical test potential to at least the at least one additional electrode to detect defects in the at least one device cell.

A test method in accordance with various embodiments may include: providing a semiconductor device to be tested, the semiconductor device being configured as a diode and including at least one device cell, the at least one device cell including at least one trench, at least one first terminal electrode region, at least one second terminal electrode region, and at least one electrode disposed at least partially in the at least one trench, wherein an electrical potential of the at least one electrode may be controlled separately from electrical potentials of the at least one first terminal electrode region and the at least one second terminal electrode region; and applying at least one electrical test potential to at least the at least one electrode to detect defects in the at least one device cell.

A test arrangement in accordance with various embodiments may include: a semiconductor device to be tested, the semiconductor device being configured as a diode and including at least one device cell, the at least one device cell including at least one trench, at least one first terminal electrode region, at least one second terminal electrode region, and at least one electrode disposed at least partially in the at least one trench, wherein an electrical potential of the at least one electrode may be controlled separately from electrical potentials of the at least one first terminal electrode region and the at least one second terminal electrode region; and a test device configured to apply at least one electrical test potential to at least the at least one electrode to detect defects in the at least one device cell.

One or more embodiments described herein above relate to a dual poly MOSFET with separate contact pad for the source poly (herein also referred to as S-Poly or Poly-S), sometimes also referred to as "XFET", and a corresponding measurement method in the front end that may be used for filtering out critical defects. One aspect of this concept may be seen in that the source poly (Poly-S) may need to be coupled separately to an independent electrical potential in the front end, and later in the back end may need to be coupled again to the (e.g., large) source pad as usual. In general, it may be desirable that two or more contact pads of a semiconductor device such as, for example the aforementioned dual poly MOSFET, be electrically disconnected from one another during the manufacturing of the device, e.g., in order to be able to apply separate electrical potentials to the pads (e.g. during front end testing), and that the pads be permanently electrically connected to one another in the finally processed device, e.g., in order to achieve a desired functionality of the device.

One approach to achieve the aforementioned application of separate potentials may be to provide separate pads in the front end, which may be connected to one another later in the back end by means of a bonding process. Examples of this concept include the use of several separate pads, or the use of an additional pad and bonding to a large source pad, or even the use of a so-called "splitted pad". However, this concept may be difficult to implement as changes to a back end process may only be designed as long-term changes and may require considerable effort.

Various embodiments described herein provide a way to obviate the aforementioned difficulties by changing the design or layout already on wafer level in the front end.

In accordance with some embodiments, metallization structures including at least two layers, for example two-layer metallizations (e.g., AlCu and Cu), and corresponding photo techniques may be used to carry out testing or screening for defects on a first metallization layer level (e.g. AlCu level) (with the contact pads, e.g. Poly-S pad and Source pad of a dual poly MOSFET, still electrically disconnected from one another) and re-establish the electrical connection between the separate contact pads (e.g. Poly-S pad and (e.g. large) Source pad) through a second (subsequent) metallization layer level (e.g. Cu level) in the back end of line (BEOL) (in other words, in the BEOL processing stage of the front end processing stage), e.g. by means of a Cu bridge. In this way, complex and/or costly measures for shorting the pads in the back end processing stage may be avoided.

In accordance with various embodiments, defect screening measurements, e.g. at a dual poly MOSFET with separate contact pad for the source poly (so-called XFET), or at other devices (e.g. any trench device with two or more gates (e.g., polys) in the trench), may be carried out in the front end on an AlCu basis with separate potentials (pads), and subsequently in the BEOL assembly these potentials (pads) may be shorted again by means of one or more Cu bridges. For example, two or more pads of one and the same device (e.g., of one and the same transistor) may be electrically separated (insulated) from one another during defect screening in order to apply different potentials to the pads, and may be electrically connected to one another (shorted) after the defect screening has been finished in order to apply one and the same potential to the pads. To this end, a multilayer metallization (in other words, a metallization layer stack) may be used including at least two metallization layers (e.g. an AlCu layer and a Cu layer on top of the AlCu layer), wherein at least one (but not all) of the at least two metallization layers forms a connecting bridge in the finally processed stage of the multilayer metallization. The at least one metallization layer forming the connecting bridge may be a layer other than the bottommost layer of the multilayer metallization. The at least one metallization layer forming the connecting bridge may, for example, contain or be made of Cu. However, other electrically conductive materials, e.g. other metals or metal alloys, may be used as well in accordance with some embodiments.

In accordance with other embodiments, a permanently conductive connection may be provided between the separate contact pads (e.g., between the Poly-S pad and Source pad, or between other separate contact pads). This permanently conductive ("normally on") connection may, for example, be implemented by a switch such as, e.g., a transistor, which may be "on" in its resting state, e.g. when no voltage is applied to the gate of the transistor ("normally on" transistor). By means of applying an appropriate control voltage to a control terminal of the switch, e.g. to the gate of a "normally on" transistor, the switch (e.g. transistor) may be turned off for the time period, during which the defect screening or tests are carried out. In other words, the electrical connection between the contact pads (e.g. Poly-S pad and Source pad) may be (temporarily) interrupted. After completion of the defect screening or test measurements the resting state of the switch, e.g. "normally on" transistor, i.e. the conductive connection between the contact pads (e.g. Poly-S pad and Source pad) may be restored, e.g. by terminating supply of the control voltage to the control terminal of the switch (e.g. gate of the transistor). In this state, the entire back end processing or assembly may be carried out in a conventional manner.

Various embodiments described herein may avoid the need for complex and/or costly back end processing to electrically short two or more separate pads.

Figure 12:
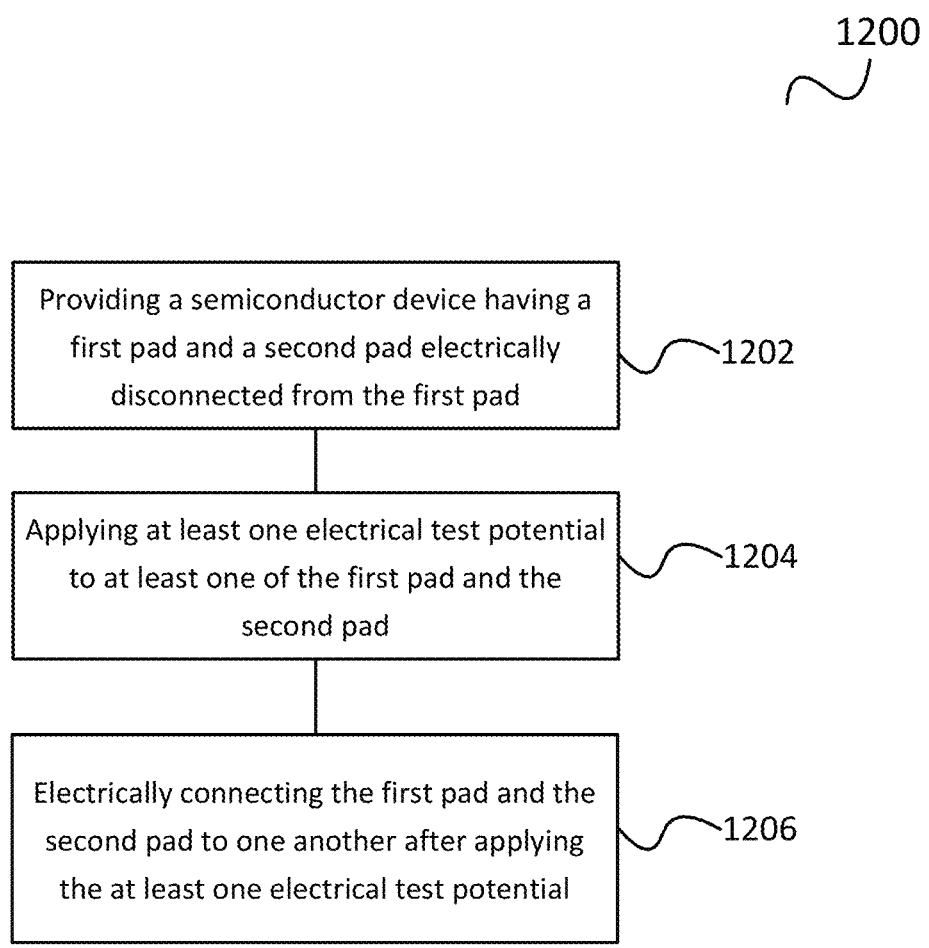
FIG. 12 shows a method for processing a semiconductor device according to various embodiments.

FIG. 12 shows a method 1200 for processing a semiconductor device in accordance with various embodiments.

Method 1200 may include: providing a semiconductor device having a first pad and a second pad electrically disconnected from the first pad (in 1202); applying at least one electrical test potential to at least one of the first pad and the second pad (in 1204); and electrically connecting the first pad and the second pad to one another after applying the at least one electrical test potential (in 1206).

In one or more embodiments, the semiconductor device may be configured as a trench transistor including a source terminal region, a drain terminal region, a gate electrode, and at least one additional electrode disposed at least partially in a trench, wherein the first pad may be coupled to the source terminal region and the second pad may be coupled to the at least one additional electrode.

In one or more embodiments, the at least one additional electrode may be configured as a shield electrode. In one or more embodiments, the at least one additional electrode may be configured as a field plate.

In one or more embodiments, the semiconductor device provided in 1202 may be configured in accordance with one or more embodiments described herein above, for example as a dual poly trench transistor (e.g. MOSFET) with separate contact pad for the source poly (so-called XFET), or as any other device that may require applying individual/separate electric potentials or signals to contact pads during device testing, wherein the contact pads are shorted in the finally processed device.

In other words, in accordance with various embodiments, the first pad and the second pad (and possibly one or more additional pads of the semiconductor device) may be pads that may need to be electrically disconnected (separated) from one another during a test measurement (e.g. defect screening test), and that may need to be electrically connected to one another after the test measurement.

In one or more embodiments, the semiconductor device may include a plurality of device cells, and the at least one electrical test potential may be configured to detect defects in the plurality of device cells.

In one or more embodiments, applying the first and second electrical test potentials to the first and second pads in 1204 may be carried out in accordance with one or more embodiments described herein above. For example, the semiconductor device may be subjected to a defect screening test as described herein above, in accordance with one or more embodiments.

In one or more embodiments, electrically connecting the first and second pads to one another in 1206 may be achieved by any suitable connection element.

In one or more embodiments, electrically connecting the first and second pads to one another in 1206 may include depositing an electrically conductive layer over at least a portion of the first and second pads.

In one or more embodiments, the electrically conductive layer may include or may be made of at least one of a metal and a metal alloy.

In one or more embodiments, the electrically conductive layer may have a larger thickness than at least one of the first and second pads.

In one or more embodiments, electrically connecting the first and second pads to one another in 1206 may be achieved by an electrically conductive bridge or bridge layer, for example a metal or metal alloy bridge, for example a Cu or Cu alloy (e.g. AlCu) bridge. Alternatively, the electrically conductive bridge may contain or be composed of other electrically conductive materials, e.g. other metals or metal alloys, e.g. a barrier layer material such as, e.g., Ti, TiN, TiW, or the like.

In one or more embodiments, the electrically conductive bridge may be formed by at least one layer (for example an upper layer, e.g. the topmost layer) of a multilayer metallization, for example by the Cu layer of an AlCu/Cu or AlSiCu/Cu metallization stack, or by the upper AlCu layer of an AlCu/AlCu metallization stack, or by the upper Cu layer of a Cu/Cu metallization stack, or the like. In this connection, the term "multilayer metallization" or "metallization stack" may be understood to include also layer arrangements where at least one of the layers contains or is made of a conductive material other than a metal or metal alloy, such as, e.g., polysilicon, or other electrically conductive materials. For example, in one embodiment, a multilayer metallization may be configured as a polysilicon/metal layer stack, e.g. a polysilicon/Cu stack (i.e., a layer stack including a polysilicon layer and a Cu layer on top of the polysilicon layer).

In one or more embodiments, the layer or layers forming the electrically conductive bridge may include or may be made of a different material or materials than the other layer or layers of the multilayer metallization.

In one or more embodiments, the layer or layers forming the electrically conductive bridge may include or may be made of the same material or materials as the other layer or layers of the multilayer metallization.

In one or more embodiments, the layer or layers forming the electrically conductive bridge may have a larger thickness than the other layer or layers of the multilayer metallization.

In one or more embodiments, the layer or layers forming the electrically conductive bridge (e.g. the Cu layer in an AlCu/Cu multilayer metallization, in one or more embodiments) may have a thickness of greater than or equal to about 3 µm, e.g. in the range from about 3 µm to about 40 µm, e.g. in the range from about 3 µm to about 15 µm.

In one or more embodiments, the other layer or layers (in other words, the layer or layers not forming the electrically conductive bridge) (e.g. the AlCu layer in an AlCu/Cu multilayer metallization, in one or more embodiments) may have a thickness of greater than or equal to about 1 µm, e.g. in the range from about 1 µm to about 10 µm, e.g. in the range from about 3 µm to about 5 µm.

In one or more embodiments, the first and second pads may be arranged at a first side (e.g., main processing surface, e.g. front side) of the semiconductor device. In general, the first and second pads may be arranged at arbitrary positions at the first side. In one or more embodiments, the first and second pads may be neighboring pads of the semiconductor device, e.g. with no electrically conductive element (e.g. gate runner) disposed between the first and second pads.

In one or more embodiments, electrically connecting the first and second pads to one another in 1206 may be achieved by any suitable connection element other than a bond wire or a clip.

In one or more embodiments, electrically connecting the first and second pads to one another in 1206 may be achieved by at least one bond wire.

In one or more embodiments, electrically connecting the first and second pads to one another in 1206 may be achieved by at least one clip.

In one or more embodiments, electrically connecting the first and second pads to one another may be carried out in a back end of line (BEOL) process or processing stage.

Figure 13A:
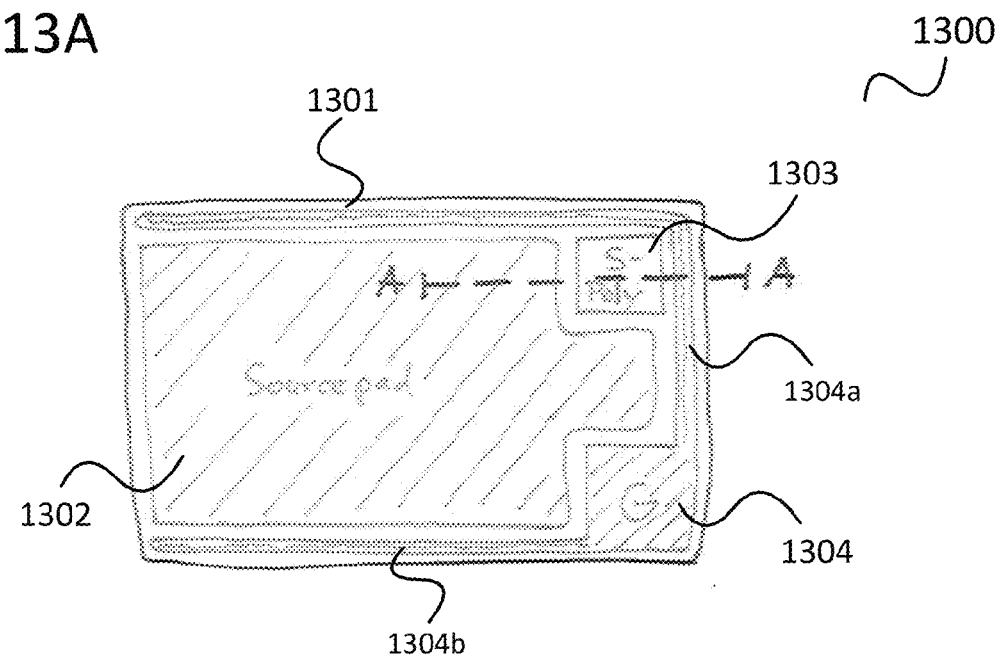
FIGS. 13A and 13B show a semiconductor device during a first processing stage according to various embodiments.
Figure 13B:
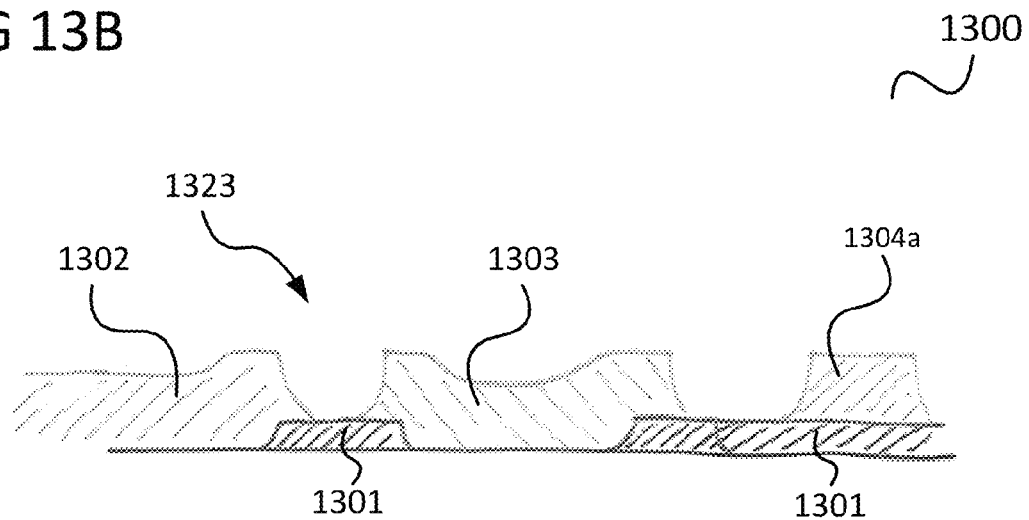

FIG. 13A shows a plan view and FIG. 13B shows a cross-sectional view along line A-A in FIG. 13A of a semiconductor device 1300 during a first processing stage, corresponding e.g. to 1202 in FIG. 12, according to various embodiments.

In one or more embodiments, the semiconductor device 1300 may be formed in or may be part of a semiconductor workpiece, for example a wafer or a chip.

The semiconductor device 1300 may include a plurality of contact pads 1302, 1303, 1304 disposed at a first side 1323 (e.g. a front side, e.g. main processing surface) of the semiconductor device 1300. The semiconductor device 1300 may be configured as a dual poly MOSFET device with separate contact pad for the source poly (so-called XFET). The semiconductor device 1300 may include a plurality of device cells (not shown) and may, for example, be configured in a similar manner as one of the semiconductor devices described herein above, e.g. one of the semiconductor devices shown in FIGS. 1A to 5.

In particular, the semiconductor device 1300 may include a first pad 1302, which may be a source pad of the XFET, a second pad 1303, which may be a source poly (Poly-S or S-Poly) pad of the XFET, and a third pad 1304, which may be a gate pad of the XFET. The first to third pads 1302, 1303, 1304 may be electrically coupled to respective terminal electrode regions or electrodes of the individual device cells of the semiconductor device 1300 in order to provide electrical potentials to the terminal electrode regions or electrodes.

For example, in case that the semiconductor device 1300 is configured in a similar manner as the semiconductor device 100 of FIG. 1A, the first pad (source pad) 1302 may be coupled to the first terminal electrode regions (source regions) 102, the second pad (S-Poly pad) 1303 may be coupled to the additional electrodes 111, and the third pad (gate pad) 1304 may be coupled to the gate electrodes 109 in FIG. 1A. In one or more embodiments, the semiconductor device 1300 may include a fourth pad (not shown in FIGS. 13A and 13B), which may be coupled to the second terminal electrode region (drain region) 103 shown in FIG. 1A. The fourth pad may, for example, be disposed at an opposite side (e.g. back side) of the semiconductor device 1300.

In one or more embodiments, at least one (e.g. all) of the pads 1302, 1303, 1304 may include or may be made of a single layer (e.g. single metal or metal alloy layer, or other electrically conductive layer), or a layer stack including a plurality of layers (e.g. a plurality of metal or metal alloy layers, or other electrically conductive layers).

In one or more embodiments, at least one (e.g. all) of the pads 1302, 1303, 1304 may have been formed by means of a suitable deposition process, which may be known as such in the art.

The pads 1302, 1303, 1304 are electrically disconnected from one another. In other words, applying or changing an electrical potential to one of the pads 1302, 1303, 1304 will have no (or only a negligible) effect on electrical potentials at the other pads. In still other words, potentials at the pads 1302, 1303, 1304 may be set and/or changed independently from one another.

In one or more embodiments, the first pad (source pad) 1302 may occupy a relatively large percentage of the area of the first side 1323 of the semiconductor device 1300, for example more than 50% of the area, as shown.

In one or more embodiments, the second pad (S-Poly pad) 1303 may be disposed next to the first pad 1302. In other words, the first and second pads 1302, 1303 may be neighboring pads. For example, there may be no electrically conductive element disposed between the first pad 1302 and the second pad 1303 at the first side 1323, as shown.

In one or more embodiments, the second pad (S-Poly pad) 1303 may be disposed at a corner of the first side 1323 of the semiconductor device 1300, e.g. upper right corner in FIG. 13A.

In one or more embodiments, the third pad (gate pad) 1304 may be disposed next to the first pad 1302. In other words, the first and third pads 1302, 1303 may be neighboring pads. For example, there may be no electrically conductive element disposed between the first pad 1302 and the third pad 1304 at the first side 1323, as shown.

In one or more embodiments, the third pad (gate pad) 1304 may be disposed at a corner of the first side 1323 of the semiconductor device 1300, e.g. lower right corner in FIG. 13A.

In one or more embodiments, the third pad (gate pad) 1304 may be coupled to one or more extensions 1304*a*, 1304*b* that may run along edges of the first side 1323 of the semiconductor device 1300, as shown in FIG. 13A. The electrically conductive extensions 1304*a*, 1304*b* may sometimes also be referred to as gate runners and may serve to provide the electrical potential that is supplied via the third pad (gate pad) 1304 to the individual gate electrodes 109 in the device cells (e.g. device cells 120 in FIG. 1A).

The semiconductor device 1300 may further include an insulating layer 1301 (e.g., an oxide layer or the like) disposed at the first side 1323 of the semiconductor device 1300, wherein the pads 1302, 1303, 1304 and/or the conductive extensions 1304*a*, 1304*b* may be electrically insulated from other electrically conductive elements or other regions of the semiconductor device 1300 by means of the insulating layer 1301.

In one or more embodiments, the pads 1302, 1303, 1304 and/or the conductive extensions 1304*a*, 1304*b* may include or may be made of an electrically conductive material such as, for example, a metal or metal alloy, e.g. AlCu in accordance with some embodiments. For example, the pads 1302, 1303, 1304 and/or the conductive extensions 1304*a*, 1304*b* may include or may consist of at least one electrically conductive layer, e.g. at least one metal or metal alloy layer.

In the processing stage shown in FIGS. 13A and 13B, the semiconductor device 1300 may be subjected to one or more test measurements, e.g. a defect screening test as described herein above, and corresponding e.g. to 1204 in FIG. 12. That is, separate test potentials may be applied to the first and second pads 1302, 1303 (and possibly to the third pad 1304 and/or fourth pad (not shown)) in order to detect, e.g., defects in the device cells of the semiconductor device 1300. Since the first pad 1302 and second pad 1303 are electrically disconnected from one another, individual test potentials may be applied to the pads 1302, 1303. The respective test potentials may be applied simultaneously or consecutively to the pads 1302, 1303. In this way, a variety of defect screening tests may be carried out at the semiconductor device 1300 that may be used to detect defective device cells, as described herein above. A test arrangement for applying respective test potentials to the first and second pads 1302, 1303 (and possibly other pads) of the semiconductor device 1300 may, for example, be configured in a similar manner as shown in FIG. 8.

Figure 14A:
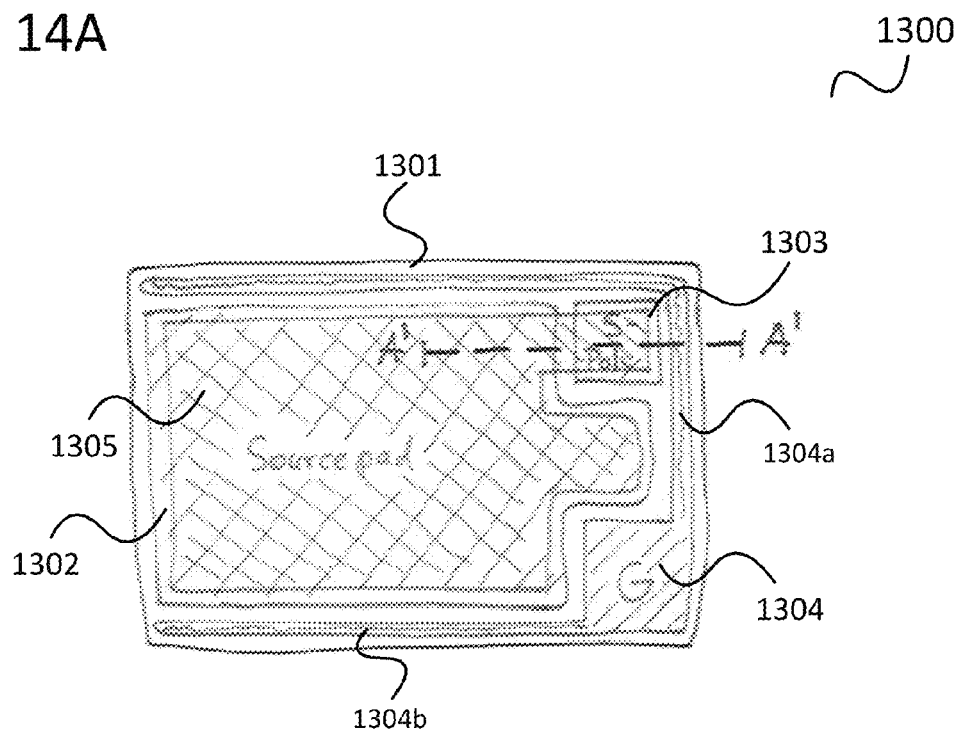
FIGS. 14A and 14B show the semiconductor device during a second processing stage according to various embodiments.
Figure 14B:
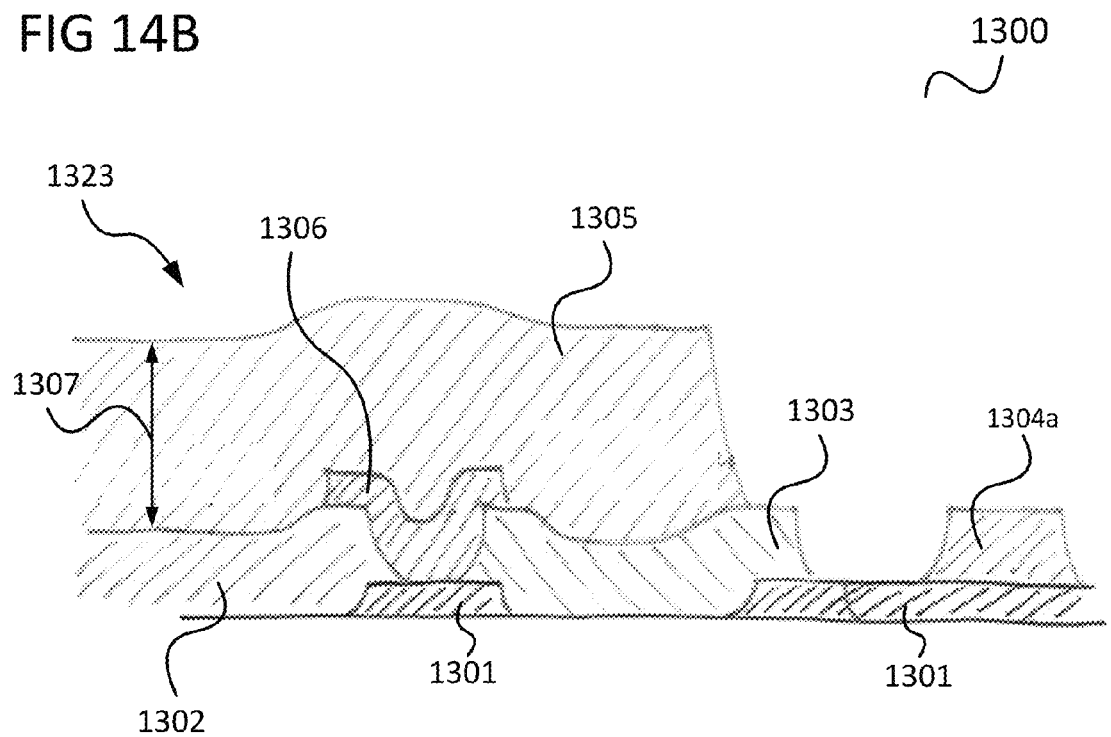

FIG. 14A shows a plan view and FIG. 14B shows a cross-sectional view along line A'-A' in FIG. 14A of the semiconductor device 1300 during a second processing stage, corresponding e.g. to 1206 in FIG. 12, according to various embodiments.

As shown in FIGS. 14A and 14B, the first pad (source pad) 1302 and the second pad (S-Poly pad) 1303 of the semiconductor device 1300 have been electrically connected to one another. To this end, an electrically conductive bridge has been formed that connects the first pad 1302 with the second pad 1303. The conductive bridge may be formed of an electrically conductive layer 1305, for example a metal or metal alloy layer, e.g. a Cu layer in one embodiment, that contacts (e.g. directly contacts) both the first pad 1302 and the second pad 1303, as shown. In one or more embodiments, the conductive layer 1305 may cover a large area, e.g. more than 50%, e.g. more than 75%, e.g. more than 80%, e.g. more than 90%, of the first pad 1302 and/or of the second pad 1303. The conductive layer, e.g. metal or metal alloy layer, 1305 may, e.g., be formed by means of a suitable deposition process.

In one or more embodiments, an insulating layer 1306 (e.g. interlayer dielectric (ILD), e.g. an oxide layer, or the like) may be formed between the first pad 1302 and the second pad 1303 before forming the conductive layer 1305, as shown. In other embodiments, the insulating layer 1306 may be omitted.

In one or more embodiments, a thickness of the conductive layer 1305 (indicated by arrow 1307 in FIG. 14B) may be larger than a thickness of the first pad 1302 and/or second pad 1303. For example, in one or more embodiments, a thickness of the first pad 1302 and/or second pad 1303 may be greater than or equal to about 1 µm, e.g. in the range from about 1 µm to about 10 µm, e.g. in the range from about 3 µm to about 5 µm, while a thickness of the conductive layer 1305 may be greater than or equal to about 3 µm, e.g. in the range from about 3 µm to about 40 µm, e.g. in the range from about 3 µm to about 15 µm, although thicknesses may be possible as well.

Illustratively, the semiconductor device 1300 shown in FIGS. 14A and 14B includes a multilayer metallization including at least two metallization layers or levels, wherein a first (lower) metallization layer or level of the multilayer metallization is constituted by the layer or layers forming the first and second pads 1302, 1303 and a second (upper) metallization layer or level of the multilayer metallization is constituted by the conductive layer 1305, and wherein the second (upper) metallization layer or level forms a conductive bridge, electrically shorting the first and second pads 1302, 1303. In accordance with one or more embodiments, the second metallization layer or level (electrically conductive bridge) may be formed in a back end of line processing stage, after one or more test measurements (e.g. defect screening test) have been carried out at the semiconductor device 1300 with electrically disconnected pads 1302, 1303.

In one or more embodiments, after forming the electrically conductive bridge, the semiconductor device 1300 shown in FIGS. 14A and 14B may subsequently be subjected to one or more additional processing steps or processes, e.g. one or more back end processing steps or processes.

In the finally processed device 1300, the first and second pads 1302, 1303 may be permanently electrically connected to one another via the conductive layer 1305, so that one and the same electrical potential may be supplied to both pads 1302 and 1303 and thus to the terminal electrode regions or electrodes coupled to the pads 1302, 1303 during normal operation of the device 1300.

Various embodiments provide a semiconductor device, which may include: at least one device cell including at least one trench, at least one first terminal electrode terminal region (e.g., a first source/drain region, e.g. a source region), at least one second terminal electrode region (e.g., a second source/drain region, e.g. a drain region), at least one gate electrode, and at least one additional electrode (e.g., a shield electrode, e.g. a field plate) disposed at least partially in the at least one trench; a first pad coupled to the at least one first electrode terminal region; a second pad coupled to the at least one additional electrode; and an electrically conductive layer disposed over at least a portion of the first pad and the second pad and electrically connecting the first pad to the second pad.

Various embodiments provide a dual poly MOSFET device with separate contact pad for the source poly (so-called XFET), in which the pad for the source poly (Poly-S) is electrically disconnected from another pad of the transistor device. In various embodiments, the source poly pad will be electrically connected to the other pad via one or more layers of a multilayer metallization, after one or more test measurements (e.g. defect screening tests) have been carried out in a state, in which the pads were electrically disconnected from one another.

Various embodiments provide a method for processing a semiconductor device, the method including: providing a semiconductor device to be tested, the semiconductor device having at least two contact pads electrically disconnected from one another; applying individual test potentials to the at least two contact pads; and electrically shorting the at least two contact pads after the test potentials have been applied.

Various embodiments provide a method for processing a semiconductor device, the method including: providing a semiconductor device to be tested, the semiconductor device having a plurality of device cells and having at least two contact pads electrically disconnected from one another and coupled to respective electrode regions or electrodes formed in the device cells; applying one or more test potentials to the at least two contact pads to detect defects in the plurality of device cells; forming a permanent electrical connection between the at least two contact pads after the one or more test potentials have been applied.

FIG. 15 shows a method 1500 for processing a semiconductor device in accordance with various embodiments.

Method 1500 may include: providing a semiconductor device having a first pad, a second pad, and a switching element coupled between the first pad and the second pad and switchable between a first state, in which the first and second pads are electrically connected to one another via the switching element, and a second state, in which the first and second pads are electrically disconnected from one another (in 1502); applying at least one electrical test potential to at least one of the first pad and the second pad while the switching element is in the second state (in 1504); and switching the switching element from the second state to the first state after applying the at least one electrical test potential to the at least one of the first and second pads (in 1506).

In one or more embodiments, providing the semiconductor device may include providing the semiconductor device with the switching element being in the first state. In other words, the switching element may be in the first state when providing the semiconductor device.

In one or more embodiments, the switching element may be switched from the first state to the second state before applying the at least one electrical test potential.

In one or more embodiments, the first state may be a resting state of the switching element.

In one or more embodiments, the switching element may be configured as a normally-on transistor.

In one or more embodiments, a first source/drain terminal of the normally-on transistor may be coupled to the first pad, and a second source/drain terminal of the normally-on transistor may be coupled to the second pad.

In one or more embodiments, the term "normally-on transistor" may include or may refer to a self-conducting transistor. In one or more embodiments, the term "normally-on transistor" may include or may refer to a transistor that is in a conducting state or "on" state when no control voltage is applied to a gate of the transistor, or when a control voltage applied to the gate of the transistor is zero or substantially zero.

In one or more embodiments, switching the switching element from the first state to the second state may include applying a control voltage to a control terminal of the switching element (e.g., applying a control voltage to a gate terminal of the normally-on transistor), and switching the switching element from the second state to the first state may include turning off application of the control voltage.

In one or more embodiments, the control voltage may be a non-zero voltage. In one or more embodiments, the control voltage may be a voltage less than zero. In one or more embodiments, the control voltage may be a voltage greater than zero.

In one or more embodiments, the switching element may be a normally-on transistor, wherein the transistor may be switched to an "off" state, e.g. by applying a suitable gate control voltage to the gate of the transistor, while the at least one electrical test potential is applied.

In one or more embodiments, the normally-on transistor may switch back from the "off" state to the "on" state as soon as the gate control voltage is no longer applied to the gate of the transistor.

Illustratively, a normal state or resting state of the switching element, e.g. the normally-on transistor, may be conducting or "on", such that the first pad and the second pad may be electrically connected to one another via the switching element, and the switching element, e.g. normally-on transistor, may temporarily be brought to a non-conducting or "off" state, e.g. for the time duration of a defect screening test. That is, during the defect screening test, the first and second pads may be electrically disconnected from one another due to the switching element being switched "off". After the defect screening (or any other test measurement) is completed, the switching element may return to its resting state, e.g. by turning off the control voltage applied to the gate of the normally-on transistor, and the first and second pad may, for example, be permanently electrically connected to one another via the switching element being switched "on".

In one or more embodiments, the semiconductor device may be configured as dual poly MOSFET with separate contact pad for the source poly (XFET), wherein the first pad may, e.g., be the source poly pad and the second pad may be the source pad of the XFET, as described herein above. However, in other embodiments, the semiconductor device may be configured in accordance with other embodiments described herein, or may generally be any device which may require that two (or more) pads be electrically disconnected during a test measurement (e.g. defect screening) in order to be able to apply individual test potentials to the pads, and be electrically connected again after the testing is completed.

In one or more embodiments, the normally-on transistor may include or may be formed in at least one trench.

In one or more embodiments, the normally-on transistor may be configured as a transistor with lateral current flow. In one or more embodiments, the term "lateral current flow" may include or may refer to a current flow that is parallel or substantially parallel to a chip surface, e.g. chip main processing surface, e.g. front side and/or back side of the chip.

In one or more embodiments, the normally-on transistor may be of the same conductivity type as a main transistor (e.g. power transistor, e.g. trench transistor, e.g. XFET) of the semiconductor device. In one or more embodiments, the term "main transistor" may include or refer to a transistor realized by the device cells or cell field of the semiconductor device.

In one or more embodiments, the normally-on transistor may be configured to have a higher breakdown voltage than the main transistor. This may, for example, be realized by the layout design, and/or the trench width design, and/or the dopant profile. For example, a drift zone of the normally-on transistor may be doped differently (e.g., by using a counter dopant implantation) than a drift zone of the main transistor, in one or more embodiments.

In one or more embodiments, the normally-on transistor may be arranged with a different orientation than the main transistor, relative to a crystallographic orientation of the chip semiconductor material (e.g. silicon). For example, a layout of the normally-on transistor may be rotated by an angle, e.g. 45°, with respect to a layout of the main transistor. For example, in one or more embodiments, the normally-on transistor may be rotated by an angle of about 45° relative to a main crystallographic orientation of the chip semiconductor material, and/or relative to an orientation of the main transistor. For example, in one or more embodiments, cell trenches of the main transistor may be aligned parallel or substantially parallel to a chip edge, while cell trenches of the normally-on transistor may be aligned at angle, e.g. 45°, to the chip edge. Illustratively, in one or more embodiments, the normally-on transistor (e.g. one or more trenches of the transistor) may be aligned in a "diagonal" direction on a chip or chip layout.

Figure 16:
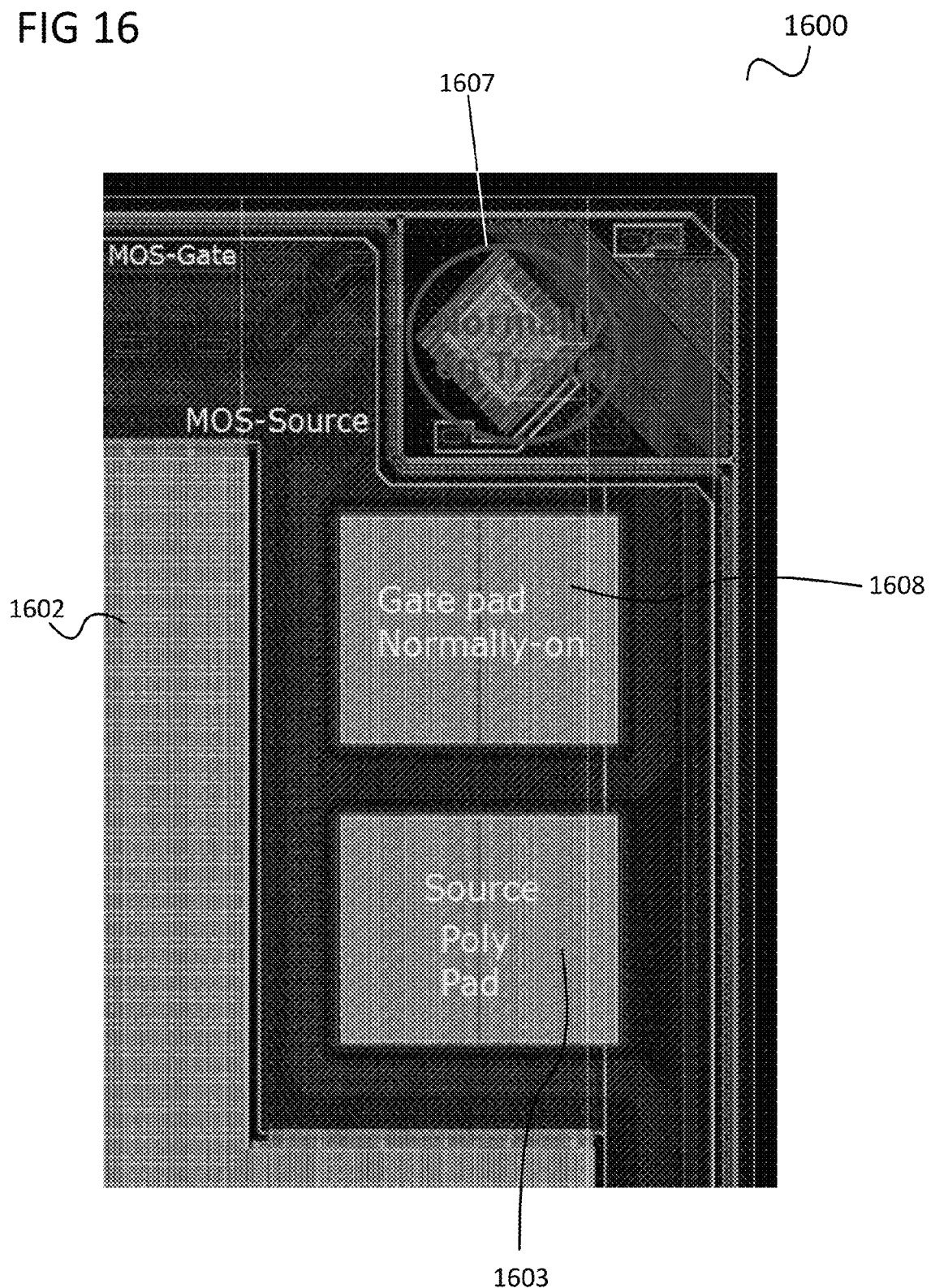
FIG. 16 shows a layout view of a semiconductor device according to various embodiments.

FIG. 16 shows a layout view of a semiconductor device 1600 according to various embodiments.

Semiconductor device 1600 may be configured as a power transistor, e.g. a power field-effect transistor, e.g. a power MOSFET (as shown), wherein FIG. 16 shows a layout view of the upper right chip corner of the power transistor. Semiconductor device 1600 may be configured as a trench device including a plurality of device cells, as described herein above, e.g. in a similar manner as shown, e.g., in FIG. 1A. Semiconductor device 1600 may be configured as an XFET device.

In one or more embodiments, semiconductor device 1600 may be formed in or may be part of a semiconductor workpiece, for example a wafer or a chip.

Semiconductor device 1600 may include a first pad 1602, which may be a source pad coupled to the source cell field (e.g. MOS source cell field, as shown) of the power transistor. For example, the first pad (source pad) 1602 may be coupled to source regions in the device cells (e.g. regions 102 in device cells 120 in FIG. 1A), as described herein above. The first pad 1602 may, e.g., be comparable to the first pad 1302 shown in FIG. 13A. Semiconductor device 1600 may further include a second pad 1603, which may be a source poly (S-Poly) pad, which may be coupled to the additional source electrodes (e.g. shield electrodes) in the device cells, as described herein above (e.g. electrodes 111 in device cells 120 in FIG. 1A). The second pad 1603 may, e.g., be comparable to the second pad 1303 shown in FIG. 13A.

Semiconductor device 1600 may further include a switching element 1607 coupled between the first pad (source pad) 1602 and the second pad (S-Poly pad) 1603. The switching element 1607 may be configured as a normally-on transistor, as shown. The transistor 1607 may have a first source/drain terminal, a second source/drain terminal, and a gate terminal. The first source/drain terminal may be coupled to the first pad 1602 and the second source/drain terminal may be coupled to the second pad 1603. The transistor 1607 may include or may be configured as a trench transistor.

Semiconductor device 1600 may further include a third pad (not shown), which may be a gate pad of the power transistor coupled to the gate electrodes in the device cells (e.g. gate electrodes 109 in device cells 120 in FIG. 1A). The third pad may, for example, be disposed in the lower right chip corner (not shown in FIG. 16), for example in a similar manner as the third pad 1304 shown in FIG. 13A. Semiconductor device 1600 may further include a fourth pad (not shown), which may be a drain pad of the power transistor coupled to the drain region of the power transistor. The fourth pad (drain pad) may, for example, be disposed at the back side of the chip, while the first pad (source pad) 1602, the second pad (source poly pad) 1603, and the third pad (gate pad) (not shown) may be disposed at the front side of the chip.

Semiconductor device 1600 may further include a fifth pad 1608, which may be a gate pad of the normally-on transistor 1607. That is, the fifth pad 1608 may be coupled to the gate terminal of the normally-on transistor 1607 so that a control voltage may be applied to the gate terminal of the normally-on transistor 1607 via the fifth pad 1608.

As is shown in FIG. 16, the MOS source cell field may be recessed by some distance from the edges of the chip in order to accommodate the normally-on transistor (and corresponding gate pad 1608) and the additional source poly pad 1603 for the XFET. In other words, the two pads 1603 and 1608 and the normally-on transistor may be integrated in the freed space of the corner of the chip (e.g., upper right corner in the example shown in FIG. 16) in accordance with some embodiments.

Figure 17:
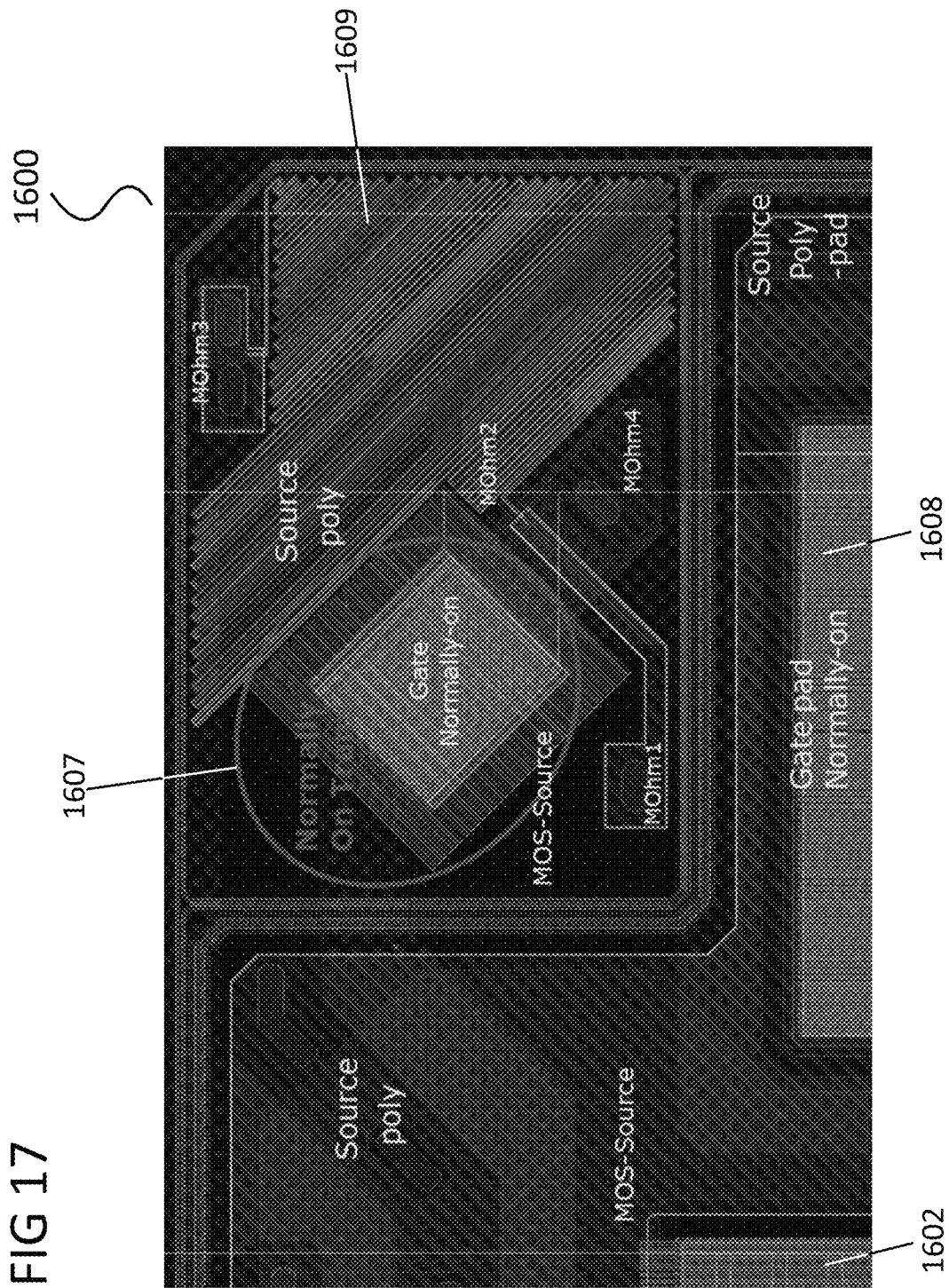
FIG. 17 shows an enlarged view of a section of FIG. 16.

FIG. 17 shows an enlarged view of a section of FIG. 16.

In FIG. 17, the direct vicinity of the normally-on transistor 1607 may be seen more clearly. A MOS source metal line (denoted "MOS-Source" in the figure) approaches the circle 1607 (indicating the normally-on transistor) from the lower left of the figure, and a source poly metal line (denoted "Source poly" in the figure) approaches the normally-on transistor 1607 from the upper right of the figure, and runs towards the left of the figure to the source polys in the cell field trenches and towards the bottom of the figure to the XFET source poly pad 1603 (see FIG. 16). A non-zero voltage (e.g. positive voltage) may be applied to the gate of the normally-on transistor 1607 (denoted "Gate Normally-on" in the figure) during the XFET defect screening measurement such that the conductive connection between the MOS source and the source polys in the cell field trenches, which would otherwise be present, may be interrupted for the time duration of this defect screening measurement.

In accordance with one or more embodiments, a high-ohmic connection may be formed from the MOS source to the gate of the normally-on transistor 1607 (for example, high-ohmic connection denoted "MOhm1-4" in the figure). In one or more embodiments, the high-ohmic-connection may have a resistance in the mega ohm (MΩ) range, e.g. a resistance greater than or equal to 1 MΩ, e.g. greater than or equal to 2 MΩ, e.g. greater than or equal to 5 MΩ, e.g. greater than or equal to 10 MΩ, e.g. greater than or equal to 20 MΩ, e.g. greater than or equal to 50 MΩ, e.g. greater than or equal to 100 MΩ, although other resistance values may be possible as well. This high-ohmic connection may be used to increase reliability of the device during the life time of the device. For example, in one or more embodiments this high-ohmic connection may prevent that a possibly floating normally-on gate (gate of the normally-on transistor 1607) accumulates charges and eventually interrupts the electrical connection of the MOS source to the source polys in the cell field trenches. The high-ohmic connection may ensure that discharge currents may flow and that the normally-on gate remains at source potential. In other words, in one or more embodiments the high-ohmic connection may prevent that the normally-on transistor switches off at some point during its life time due to charge accumulation at its gate.

In one or more embodiments, this high-ohmic connection may be formed in a long dual-poly trench meander (at "MOhm2") The high-ohmic connection may start (at "MOhm1") with a contact to the lower poly in the trench, change (at "MOhm3") from the lower poly to the upper poly in the trench, and eventually contact the normally-on gate (at "MOhm4"). In other words, a trench having a meandering structure 1609 may be provided, wherein a lower poly and an upper poly are formed in the meandering trench 1609, and wherein at one end of the meandering trench 1609 the lower poly is coupled to the MOS source and the upper poly is coupled to the gate of the normally-on transistor, and wherein at the other end of the meandering trench 1609 the lower poly is coupled to the upper poly. Thus, a current may flow "back and forth" in the meandering trench structure 1609.

Figure 18:
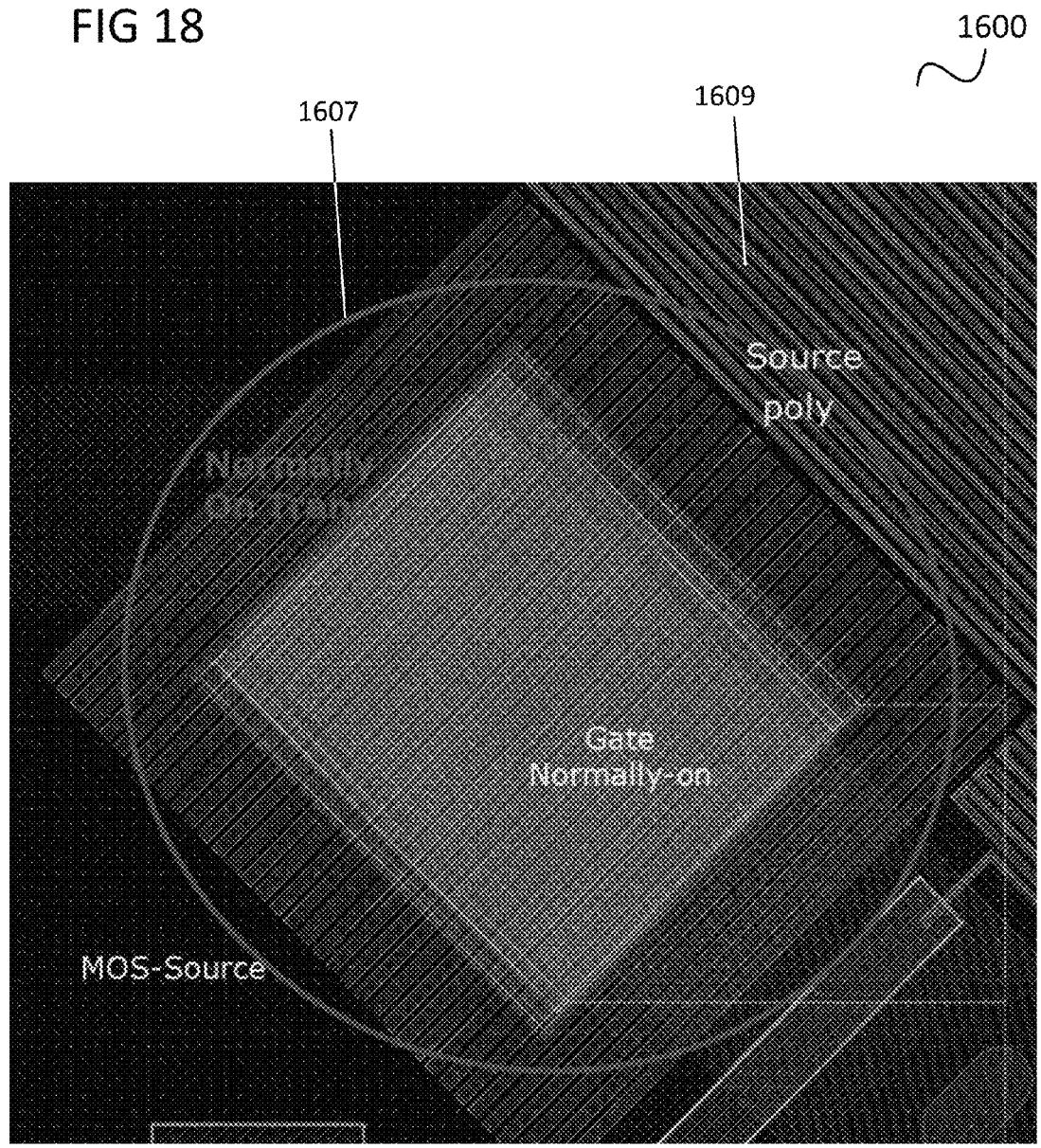
FIG. 18 shows an enlarged view of a section of FIG. 17.

FIG. 18 shows an enlarged view of a section of FIG. 17.

FIG. 18 serves to further illustrate the configuration of the normally-on transistor 1607 of the semiconductor device 1600.

In accordance with one or more embodiments, the normally-on transistor 1607 may be implemented with a layout that is rotated by 45°, e.g. compared to a layout of the cell field trenches. This may have the effect that a field oxide thickness in the trench is significantly higher than in the cell field. This may have the effect that in an avalanche situation a reverse voltage (also referred as blocking voltage) of the transistor 1607 may be higher, e.g. by about 10 V in some embodiments, as in the main cell field, and thus the main cell field system will not be disturbed. Also, the trench widths, and thus also the trench depths, may be larger than in the cell field, which may also lead to a higher breakdown strength. The same source and body regions as in the main cell field may be provided in the layout rotated by 45°. This may be realized without extra effort. However, the normally-on transistor 1607 may be configured as a lateral transistor (in other words, a transistor with lateral current flow direction), wherein the current flows lateral (in other words, parallel to the chip surface) in the "on" state, as opposed to the main cell field with vertical current flow. In order to adjust an onset voltage for the normally-on transistor, the body region may be counter doped near the surface using a slight counter implantation, in accordance with one or more embodiments. This counter implantation may be the only additional process compared to a conventional MOS process flow.

In accordance with one or more embodiments, the lateral normally-on transistor may also be realized in the trenches that are already present, or in a trench that has been drawn with an extreme width (very wide trench well), and may in each case be realized by means of embedded poly structures, in accordance with some embodiments.

Various embodiments provide a semiconductor device, which may include: at least one device cell including at least one trench, at least one first terminal electrode terminal region, at least one second terminal electrode region, at least one gate electrode, and at least one additional electrode disposed at least partially in the at least one trench; a first pad coupled to the at least one first electrode terminal region; a second pad coupled to the at least one additional electrode; a switching element electrically coupled between the first pad and the second pad and switchable between a first state, in which the first and second pads are electrically connected to one another via the switching element, and a second state, in which the first and second pads are electrically disconnected from one another.

In one or more embodiments, the first state may be a resting state of the switching element.

In one or more embodiments, the switching element may be a normally-on transistor.

In one or more embodiments, the semiconductor device may further include an additional pad coupled to a gate electrode of the normally-on transistor.

In one or more embodiments, the semiconductor device may further include a high-ohmic electrical connection coupling the first pad to a gate electrode of the normally-on transistor.

In one or more embodiments, the high-ohmic electrical connection may include a meandering trench structure.

In one or more embodiments, the normally-on transistor may have a higher breakdown voltage than a transistor formed from the at least one device cell.

In one or more embodiments, a layout of the normally-on transistor may be rotated by an angle compared to a layout of a transistor formed from the at least one device cell.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for processing a semiconductor device, comprising:
   providing the semiconductor device having a first pad and a second pad electrically disconnected from the first pad;
   applying at least one electrical test potential to at least one of the first pad and the second pad; and
   electrically connecting the first pad and the second pad to one another after applying the at least one electrical test potential;
   wherein the semiconductor device comprises a plurality of device cells, and
   wherein the at least one electrical test potential is configured to detect defects in the plurality of device cells.

2. The method of claim 1, wherein the semiconductor device is configured as a trench transistor comprising a source terminal region, a drain terminal region, a gate electrode, and at least one additional electrode disposed at least partially in a trench,
   wherein the first pad is coupled to the source terminal region and the second pad is coupled to the at least one additional electrode.

3. The method of claim 2, wherein the at least one additional electrode is configured as a shield electrode.

4. The method of claim 1, wherein electrically connecting the first and second pads to one another comprises depositing an electrically conductive layer over at least a portion of the first and second pads.

5. The method of claim 4, wherein the electrically conductive layer comprises at least one of a metal and a metal alloy.

6. The method of claim 4, wherein the electrically conductive layer has a larger thickness than at least one of the first and second pads.

7. The method of claim 1, wherein the first and second pads are neighboring pads with no electrically conductive element disposed between the first and second pads.

8. The method of claim 1, wherein electrically connecting the first and second pads to one another is carried out in a back end of line processing stage.

9. A semiconductor device, comprising:
- at least one device cell comprising at least one trench, at least one first terminal electrode region, at least one second terminal electrode region, at least one gate electrode, and at least one additional electrode disposed at least partially in the at least one trench;
- a first pad coupled to the at least one first terminal electrode region;
- a second pad coupled to the at least one additional electrode;
- an electrically conductive layer disposed over at least a portion of the first pad and the second pad and electrically connecting the first pad to the second pad.

10. A method for processing a semiconductor device, comprising:
- providing the semiconductor device having a first pad, a second pad, and a switching element coupled between the first pad and the second pad and switchable between a first state, in which the first and second pads are electrically connected to one another via the switching element, and a second state, in which the first and second pads are not electrically connected to one another via the switching element;
- applying at least one electrical test potential to at least one of the first and second pads while the switching element is in the second state; and
- switching the switching element from the second state to the first state after applying the at least one electrical test potential to the at least one of the first and second pads.

11. The method of claim 10, wherein providing the semiconductor device comprises providing the semiconductor device with the switching element being in the first state, the method further comprising:
- switching the switching element from the first state to the second state before applying the at least one electrical test potential.

12. The method of claim 10, wherein the first state is a resting state of the switching element.

13. The method of claim 10, wherein the switching element is configured as a normally-on transistor.

14. The method of claim 11, wherein switching the switching element from the first state to the second state comprises applying a control voltage to a control terminal of the switching element, and wherein switching the switching element from the second state to the first state comprises turning off application of the control voltage.

15. A semiconductor device, comprising:
- at least one device cell comprising at least one trench, at least one first terminal electrode region, at least one second terminal electrode region, at least one gate electrode, and at least one additional electrode disposed at least partially in the at least one trench;
- a first pad coupled to the at least one first terminal electrode region;
- a second pad coupled to the at least one additional electrode;
- a switching element electrically coupled between the first pad and the second pad and switchable between a first state, in which the first and second pads are electrically connected to one another via the switching element, and a second state, in which the first and second pads are electrically disconnected from one another.

16. The semiconductor device of claim 15, wherein the first state is a resting state of the switching element.

17. The semiconductor device of claim 15, wherein the switching element is a normally-on transistor.

18. The semiconductor device of claim 17, further comprising an additional pad coupled to a gate electrode of the normally-on transistor.

19. The semiconductor device of claim 17, further comprising a high-ohmic electrical connection coupling the first pad to a gate electrode of the normally-on transistor.

20. The semiconductor device of claim 19, wherein the high-ohmic electrical connection comprises a meandering trench structure.

21. The semiconductor device of claim 17, wherein the normally-on transistor has a higher breakdown voltage than a transistor formed from the at least one device cell.

22. The semiconductor device of claim 17, wherein a layout of the normally-on transistor is rotated by an angle compared to a layout of a transistor formed from the at least one device cell.

* * * * *